United States Patent
Wilson et al.

(10) Patent No.: US 10,167,410 B2
(45) Date of Patent: Jan. 1, 2019

(54) USING CHEMICAL VAPOR DEPOSITED FILMS TO CONTROL DOMAIN ORIENTATION IN BLOCK COPOLYMER THIN FILMS

(71) Applicant: Board of Regents, The University of Texas System, Austin, TX (US)

(72) Inventors: C. Grant Wilson, Austin, TX (US); William J. Durand, Austin, TX (US); Christopher John Ellison, Austin, TX (US); Christopher M. Bates, Austin, TX (US); Takehiro Seshimo, Austin, TX (US); Julia Cushen, Austin, TX (US); Logan J. Santos, Austin, TX (US); Leon Dean, Spokane, WA (US); Erica L. Rausch, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 492 days.

(21) Appl. No.: 14/698,253

(22) Filed: Apr. 28, 2015

(65) Prior Publication Data
US 2015/0232689 A1    Aug. 20, 2015

Related U.S. Application Data

(62) Division of application No. 13/761,324, filed on Feb. 7, 2013, now Pat. No. 9,040,121.
(Continued)

(51) Int. Cl.
| C09D 153/00 | (2006.01) |
| C03C 17/34 | (2006.01) |
| C03C 17/30 | (2006.01) |

(52) U.S. Cl.
CPC ............ *C09D 153/00* (2013.01); *C03C 17/30* (2013.01); *C03C 17/3405* (2013.01);
(Continued)

(58) Field of Classification Search
CPC ..... Y10T 428/24802; Y10T 428/31663; Y10T 428/31931; C09D 153/00
See application file for complete search history.

(56) References Cited

U.S. PATENT DOCUMENTS

| 4,945,856 A | 8/1990 | Stewart | 118/715 |
| 5,078,091 A | 1/1992 | Stewart | 118/719 |

(Continued)

FOREIGN PATENT DOCUMENTS

| EP | 0785073 A2 | 7/1997 |
| WO | WO/1997/006760 | 2/1997 |

(Continued)

OTHER PUBLICATIONS

Bates, C. M. et al. (2011) "Polymeric Cross-Linked Surface Treatments for Controlling Block Copolymer Orientation in Thin Films," *Langmuir* 27(5), 2000-2006.
(Continued)

*Primary Examiner* — Betelhem Shewareged
(74) *Attorney, Agent, or Firm* — Medlen & Carroll, LLP

(57) ABSTRACT

Vacuum deposited thin films of material are used to create an interface that non-preferentially interacts with different domains of an underlying block copolymer film. The non-preferential interface prevents formation of a wetting layer and influences the orientation of domains in the block copolymer. The purpose of the deposited polymer is to produce nano structured features in a block copolymer film that can serve as lithographic patterns.

20 Claims, 18 Drawing Sheets

Related U.S. Application Data

(60) Provisional application No. 61/597,295, filed on Feb. 10, 2012.

(52) U.S. Cl.
CPC . *C03C 2218/152* (2013.01); *Y10T 428/24802* (2015.01); *Y10T 428/31663* (2015.04); *Y10T 428/31931* (2015.04)

(56) References Cited

U.S. PATENT DOCUMENTS

| | | | |
|---|---|---|---|
| 5,268,033 A | 12/1993 | Stewart | 118/719 |
| 5,488,833 A | 2/1996 | Stewart | 62/55.5 |
| 5,534,068 A | 7/1996 | Beach et al. | 118/719 |
| 5,536,319 A | 7/1996 | Wary et al. | 118/719 |
| 5,536,321 A | 7/1996 | Olsen et al. | 118/719 |
| 5,536,322 A | 7/1996 | Wary et al. | 118/719 |
| 5,538,758 A | 7/1996 | Beach et al. | 427/255.6 |
| 5,556,473 A | 9/1996 | Olson et al. | 118/719 |
| 5,641,358 A | 6/1997 | Stewart | 118/715 |
| 5,709,753 A | 1/1998 | Olson et al. | 118/719 |
| 6,406,544 B1 | 6/2002 | Stewart | 118/719 |
| 6,737,224 B2 | 5/2004 | Stewart | 430/322 |
| 2008/0113283 A1* | 5/2008 | Ghoshal | B82Y 10/00 430/22 |
| 2009/0181171 A1 | 7/2009 | Cheng et al. | 427/240 |
| 2010/0316849 A1 | 12/2010 | Millward et al. | 428/195.1 |
| 2011/0147984 A1 | 6/2011 | Cheng et al. | 427/259 |
| 2011/0186544 A1 | 8/2011 | Endou et al. | 216/58 |
| 2012/0202017 A1 | 8/2012 | Nealey et al. | 428/195.1 |
| 2013/0266780 A1 | 10/2013 | Ellison et al. | 427/216 |

FOREIGN PATENT DOCUMENTS

| | | |
|---|---|---|
| WO | WO/2001/039986 | 6/2001 |
| WO | WO/2011/116223 | 9/2011 |

OTHER PUBLICATIONS

Bates, F. S. et al. (1990) "Block copolymer thermodynamics: theory and experiment," *Annual Review of Physical Chemistry* 41, 525-557.

Colburn, M. et al. (2000) "Step and flash imprint lithography for sub-100-nm patterning," *Proceedings of SPIE—The International Society for Optical Engineering* 3997, 453-457.

Fortin, J. B. et al. (2000) "Mass spectrometry study during the vapor deposition of poly-para-xylylene thin films," *Journal of Vacuum Science & Technology A: Vacuum, Surfaces, and Films* 18(5), 2459-2465.

Gillham, J. K. (1986) "Formation and Properties of Thermosetting and High $T_g$ Polymeric Materials," *Polymer Engineering and Science* 26(20), 1429-1433.

Gorham, W. F. (1966) "A New, General Synthetic Method for the Preparation of Linear Poly-p-xylylenes," *Journal of Polymer Science Part A: Polymer Chemistry* 4(12), 3027-3039.

Han, E. et al. (2009) "Perpendicular Orientation of Domains in Cylinder-Forming Block Copolymer Thick Films by Controlled Interfacial Interactions," *Macromolecules* 42(13), 4896-4901.

Kim, H.-C. et al. (2001) "A Route to Nanoscopic $SiO_2$ Posts via Block Copolymer Templates," *Advanced Materials* 13(11), 795-797.

Kim, H.-C. et al. (2009) "Block Copolymer Based Nanostructures: Materials, Processes, and Applications to Electronics," *Chemical Reviews* 110(1), 146-177.

Lammertink, R. G. H. et al. (2000) "Nanostructured Thin Films of Organic-Organometallic Block Copolymers: One-Step Lithography with Poly(ferrocenylsilanes) by Reactive Ion Etching," *Advanced Materials* 12(2), 98-103.

Li, M. et al. (2006) "Block copolymer patterns and templates," *Materials Today* 9(9), 30-39.

Milner, S. T. (1991) "Polymer brushes," *Science* 251(4996), 905-914.

Nagarajan, S. et al. (2008) "An Efficient Route to Mesoporous Silica Films with Perpendicular Nanochannels," *Advanced Materials* 20(2), 246-251.

Peng, J. et al. (2007) "Development of nanodomain and fractal morphologies in solvent annealed block copolymer thin films," *Macromolecular Rapid Communications* 28(13), 1422-1428.

Ross, C. A. (2001) "Patterned Magnetic Recording Media," *Annual Review of Materials Research* 31(1), 203-238.

Ruiz, R. et al. (2008) "Density multiplication and improved lithography by directed block copolymer assembly," *Science* 321(5891), 936-939.

Walton, D. G. et al. (1994) "A Free Energy Model for Confined Diblock Copolymers," *Macromolecules* 27(21), 6225-6228.

Zhao, B. et al. (2000) "Polymer brushes: surface-immobilized macromolecules," *Progress in Polymer Science* 25(5), 677-710.

PCT International Search Report of International Application No. PCT/US2013/025145 dated Apr. 6, 2003.

* cited by examiner

FIGURE 12

| Parylene Type | $T_g$ (deg C) |
|---|---|
| N | 80 |
| Cl | 80 |
| Br | 80 |
| Di-Cl | 110 |

* Gorham, W. F. (1966) A New, General Synthetic Method for the Preparation of Linear Poly-p-xylylenes, *Journal of Polymer Science Part A-1: Polymer Chemistry 4*, 3027-3039 [11].

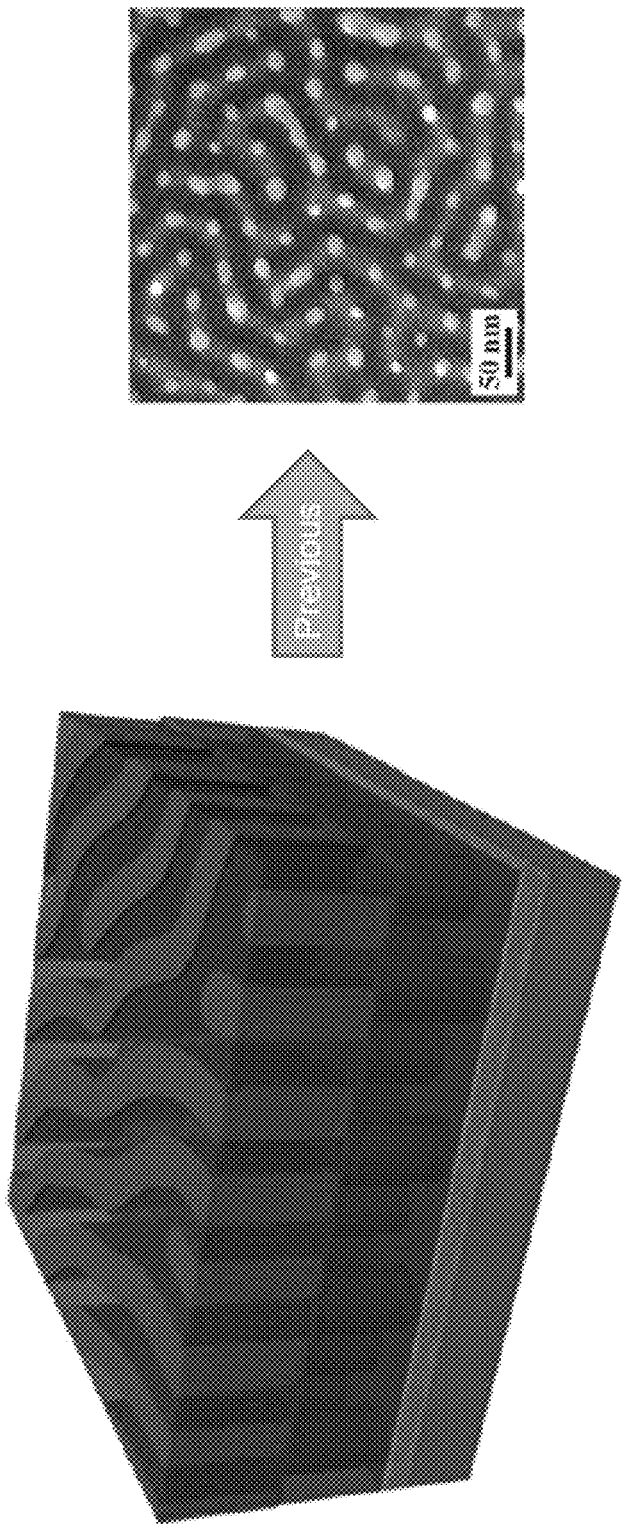

FIGURE 13

Nano structures revealed after parylene top coat is applied, film stack annealed and etching with oxygen plasma through parylene layer to expose block copolymer nanostructures. Without parylene, attempts to etch wiht oxygen plasma alone are unsuccessful due to silicon wetting layer that forms at air-block copolymer interface, which is unetchable with oxygen plasma alone.

Experimental Procedure (Cont.)

7) Anneal the thin films at 170 °C for 18 hours.

Surface Energy Neutralizing Layer

8) Oxygen plasma etch the block copolymer with the following conditions:
Pressure = 90 mTorr, RF Power = 80 W, ICP Power = 100 W, O2 flow rate = 5 standard cubic centimeters per minute (SCCM), temperature = 15 °C, time = 35 seconds.

Alternative Procedure (Cont)

5) Anneal the thin films at 170 °C for 18 hours.

6) Oxygen plasma etch the block copolymer with the following conditions:
Pressure = 90 mTorr, RF Power = 80 W, ICP Power = 100 W, O2 flow rate = 5 standard cubic centimeters per minute (SCCM), temperature = 15 °C, time = 35 seconds.

USING CHEMICAL VAPOR DEPOSITED FILMS TO CONTROL DOMAIN ORIENTATION IN BLOCK COPOLYMER THIN FILMS

This application claims the benefit of priority to Provisional Application U.S. Ser. No. 61/597,295, which was filed on Feb. 10, 2012, the disclosures of which are incorporated herein by reference.

FIELD OF THE INVENTION

The present invention uses vacuum deposited thin films of material to create an interface that non-preferentially interacts with different domains of an underlying block copolymer film. The non-preferential interface prevents formation of a wetting layer and influences the orientation of domains in the block copolymer. The purpose of the deposited polymer is to produce nanostructured features in a block copolymer film that can serve as lithographic patterns.

BACKGROUND OF THE INVENTION

The improvement in areal density in hard disk drives using conventional multigrain media is currently bound by the superparamagnetic limit [1]. Bit patterned media can circumvent this limitation by creating isolated magnetic islands separated by a nonmagnetic material. Nanoimprint lithography is an attractive solution for producing bit patterned media if a template can be created with sub-25 nm features [2]. Resolution limits in optical lithography and the prohibitive cost of electron beam lithography due to slow throughput [3] necessitate a new template patterning process. The self-assembly of diblock copolymers into well-defined structures [4] on the order of 5-100 nm produces features on the length scale required for production of bit patterned media. This is most efficiently accomplished by using block copolymers to produce templates for imprint lithography [5]. With the availability of the proper template, imprint lithography can be employed to produce bit-patterned media efficiently. Previous research has targeted block copolymers that produce hexagonally packed cylindrical morphology with selective silicon incorporation into one block for etch resistance [6] through post-polymerization $SiO_2$ growth [7], silica deposition using supercritical $CO_2$ [8], and silicon-containing ferrocenyl monomers [9]. What is needed is method to create an imprint template with sub-100 nm features with the desired structural alignment of nanostructures that can be etched with the good oxygen etch contrast that silicon provides.

SUMMARY OF THE INVENTION

In one embodiment, the invention relates to a method to achieve block copolymer domain orientation by a) coating block copolymer film on a substrate, b) applying a top coat on top of the block copolymer by depositing in the gas phase, and c) annealing. In one embodiment, said annealing is by exposure to solvent vapors. In one embodiment, said annealing is by heating. In one embodiment, said substrate comprises silicon. In one embodiment, said substrate is a silicon wafer. In one embodiment, said substrate is quartz. In one embodiment, said substrate is glass. In one embodiment, said substrate is plastic. In one embodiment, said substrate is a transparent substrate. In one embodiment, said substrate is a roll-to-roll substrate. In one embodiment, said substrate is coated with a substrate surface energy neutralizing layer with surface energy in between that of two blocks. In one embodiment, said substrate surface energy neutralizing layer is selected from the group consisting of: (a) high Tg polymer, (b) a cross-linked polymer, (c) vapor deposited polymer such as parylene, (d) small molecule derivatives of silylating agents, and (e) polymer brush by end-attaching polymer to substrate. In one embodiment, said block copolymer contains on block with at least 10% by weight silicon. In one embodiment, said topcoat is organic. In one embodiment, said topcoat is an inorganic oxide. In one embodiment, said topcoat is a parylene. In one embodiment, said topcoat is a parylene derivative. In one embodiment, said parylene is selected from the group consisting of: Parylene N, Parylene D, Parylene C, Parylene HT®, and Parylene X. In one embodiment, the method further comprises: d) treating said layered structure under conditions such that nanostructures form. In one embodiment, said treating comprises annealing. In one embodiment, said annealing comprises heating. In one embodiment, the method further comprises: e) etching said layered structure under conditions such that the topcoat and part of the block copolymer is removed revealing said nanostructures. In one embodiment, said block copolymers form nanostructured materials that can be used as etch masks in lithographic patterning processes. In one embodiment, a third monomer is provided and said block copolymer is a triblock copolymer. In one embodiment, the invention relates to the etched nanostructures made according to the process described above. In one embodiment, said etching comprises oxygen etching. In one embodiment, said nanostructures are selected from the group consisting of: lamellae, cylinders, vertically aligned cylinders, horizontally alligned cylinders, spheres, gyroids, network structures, and hierarchical nanostructures. In one embodiment, said nanostructures comprise cylindrical structures, said cylindrical structures being substantially vertically aligned with respect to the plane of the surface. In one embodiment, the proportions of the components can be varied such that the surface energy of the layer is varied. In one embodiment, the surface energy switches as the treatment composition is thermally annealed. In one embodiment, applying the surface energy neutralizing layer comprises: i) dissolving said surface energy neutralizing layer polymer in a solvent; ii) spin coating the surface energy neutralizing layer polymer upon the surface; iii) cross-linking by exposure to 250° C. for 5 minutes; and iv) subsequently washing with solvent. In one embodiment, said solvent is toluene.

In one embodiment, the invention relates to a layered structure comprising first, second and third layers on a surface, wherein said first layer comprises a surface energy neutralizing layer, wherein said second layer comprises a block copolymer film, and wherein said third layer comprises parylene. In one embodiment, said surface comprises silicon.

In one embodiment, the invention relates to a method of applying a top coat to a block copolymer film to create a layered structure, comprising: a) providing a surface, a surface energy neutralizing layer, a block copolymer, and a composition comprising parylene; b) treating said surface under conditions such that a first layer on said surface is created, said layer comprising a crosslinked polymer; c) coating said first layer with block copolymer under conditions such that a second layer on said surface is created comprising a block copolymer film; and d) depositing said composition by vacuum deposition on said second layer so as to create a third layer on said surface, said third layer comprising a top coat on said block copolymer film surface, said first, second and third layers comprising a layered structure. In one embodiment, the invention further comprises: e) treating said layered structure under conditions such that nanostructures form. In one embodiment, said treating comprises annealing. In one embodiment, said annealing comprises heating. In one embodiment, the invention further comprises: f) etching said layered structure under conditions such that the topcoat and part of the block copolymer is removed revealing said nanostructures. In one embodiment, said etching comprises oxygen etching. In one embodiment, said nanostructures comprise cylindrical structures, said cylindrical structures being substantially vertically aligned with respect to the plane of the surface. In one embodiment, said block copolymer is made from at polymers from at least two monomers. In one embodiment, said nanostructures comprise cylindrical structures, said cylindrical structures being substantially vertically aligned with respect to the plane of the surface. In one embodiment, said surface is on a silicon wafer. In one embodiment, said surface energy neutralizing layer polymer has been deposited by spin coat treatment upon the surface of said silicon wafer. In one embodiment, said block copolymers form nanostructured materials that can be used as etch masks in lithographic patterning processes. In one embodiment, a third monomer is provided and said block copolymer is a triblock copolymer. In one embodiment, the invention relates to the etched nanostructures made according to the process described above.

In one embodiment, the present invention discloses a method of applying a top coat to a block copolymer film to create a layered structure, comprising: a) providing a surface, a block copolymer, and a parylene; b) treating said surface under conditions such that a first layer on said surface is created, said layer comprising a crosslinked polymer; c) coating said first layer with block copolymer under conditions such that a second layer on said surface is created comprising a block copolymer film; and d) depositing said parylene by vacuum deposition on said second layer so as to create a third layer on said surface, said third layer comprising a top coat on said block copolymer film surface, said first, second and third layers comprising a layered structure. In one embodiment, further comprises step e) treating said layered structure under conditions such that nanostructures form. In one embodiment, said treating comprises annealing. In one embodiment, said annealing comprises heating. In one embodiment, the method further comprising: step f) etching said layered structure under conditions such that the topcoat and part of the block copolymer is removed revealing said nanostructures. In one embodiment, said etching comprises oxygen etching. In one embodiment, said nanostructures comprise cylindrical structures, said cylindrical structures being substantially vertically aligned with respect to the plane of the surface. In one embodiment, said parylene is selected from the group comprising: Parylene N, Parylene D, Parylene C, Parylene HT®, and Parylene X. In one embodiment, said surface is on a silicon wafer. In one embodiment, said surface energy neutralizing layer polymer comprises a parylene. In one embodiment, said surface energy neutralizing layer polymer is composed of various polymer components one of which is a parylene. In one embodiment, said surface energy neutralizing layer polymer components must be capable of vapor deposition. In one embodiment, the proportions of the parylene components can be varied such that the surface energy of the surface energy neutralizing layer polymer layer is varied. In one embodiment, the surface energy switches as the surface energy neutralizing layer polymer is thermally annealed. In one embodiment, the invention relates to the the nanostructures made according to the process of described above. In one embodiment, said surface under conditions such that said surface energy neutralizing layer polymer is cross-linked to said surface comprises: i) dissolving said surface energy neutralizing layer polymer in a solvent; ii) spin coating the surface energy neutralizing layer polymer upon the surface; iii) cross-linking by exposure to 250° C. for 5 minutes; and iv) subsequently washing with solvent. In one embodiment, said solvent is toluene. In one embodiment, said surface energy neutralizing layer polymer is selected from the group comprising:

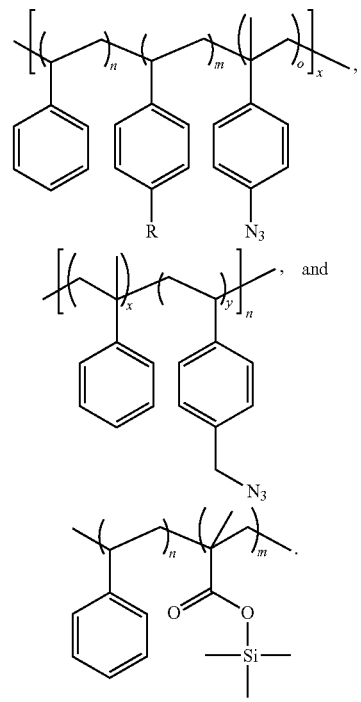

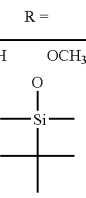

In one embodiment, said block copolymer is selected from the group comprising:

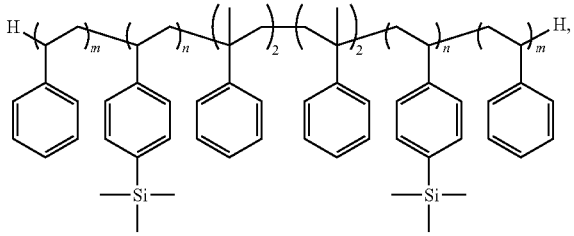

TMSS-Sty, MTMSMA-Sty. In one embodiment, said conditions to create a block copolymer film comprise: i) dissolving said block copolymer in a solvent; ii) spin coating the block copolymer upon the surface with one of the following surface treatments 1) cross-linked with surface energy neutralizing layer polymer 2) high Tg polymer, 3) vapor deposited polymer, 4) traditional functionalized silane treatment, and 5) a polymer brush where on end of the polymer is covalently attached to the surface; and iii) subsequently baking for 110° C. for 1 minutes. In one embodiment, said solvent is toluene. In one embodiment, the method further comprises step e) comprises heating the thin film at 170° C. for 18 hours. In one embodiment, the invention comprises the etched nanostructures made according to the process of described above. In one embodiment, the invention comprises a layered structure comprising first, second and third layers on a surface, wherein said first layer comprises a surface treatment selected from the group consisting of: 1) cross-linked with surface energy neutralizing layer polymer 2) high Tg polymer, 3) vapor deposited polymer, 4) traditional functionalized silane treatment, and 5) a polymer brush where on end of the polymer is covalently attached to the surface; wherein said second layer comprises a block copolymer film, and wherein said third layer comprises parylene. In one embodiment, said surface comprises silicon, glass, or quartz. In one embodiment, aid top coat composition is composed of various polymer components one of which is a parylene. In one embodiment, said top coat components must be capable of vapor deposition. In one embodiment, the proportions of the components can be varied such that the surface energy of the top coat layer is varied. the surface energy switches as the top coat is baked. In one embodiment, comprising a further step f) wherein the domain orientation controlled the block copolymer film is etched to produce a oxygen plasma etch the block copolymer with the following conditions: Pressure=90 mTorr, RF Power=80 W, ICP Power=100 W, $O_2$ flow rate=5 standard cubic centimeters per minute (SCCM), temperature=15° C., time=35 seconds. In one embodiment, the invention relates to the etched nanostructures made according to the process of described above. In one embodiment, the invention relates to a layered structure comprising wherein the top layer is a parylene.

In one embodiment, the invention relates to a method of applying a top coat to a block copolymer film to create a layered structure, comprising: a) providing a surface, a block copolymer, and a parylene with the structure

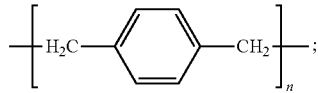

b) treating said surface under conditions such that a first layer on said surface is created, said layer comprising a crosslinked polymer; c) coating said first layer with block copolymer under conditions such that a second layer on said surface is created comprising a block copolymer film; and d) depositing said parylene by vacuum deposition on said second layer so as to create a third layer on said surface, said third layer comprising a top coat on said block copolymer film surface, said first, second and third layers comprising a layered structure. In one embodiment, the method, further comprising e) treating said layered structure under conditions such that nanostructures form. In one embodiment, said treating comprises annealing. In one embodiment, said annealing comprises heating. In one embodiment, In one embodiment, the method, further comprising f) etching said layered structure under conditions such that the topcoat and part of the block copolymer is removed revealing said nanostructures. In one embodiment, said etching comprises oxygen etching. In one embodiment, said nanostructures comprise cylindrical structures, said cylindrical structures being substantially vertically aligned with respect to the plane of the surface. In one embodiment, the block copolymer has the structure:

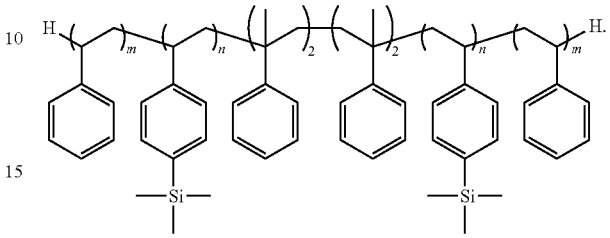

In one embodiment, said block copolymer is made from at least two monomers. In one embodiment, said first monomer comprises a silicon atom that can be polymerized. In one embodiment, said second monomer comprises a monomer lacking silicon that can be polymerized. In one embodiment, said nano structures comprise cylindrical structures, said cylindrical structures being substantially vertically aligned with respect to the plane of the surface. In one embodiment, said treating comprises vacuum deposition of a polymer on said coated block copolymer film surface. In one embodiment, said surface is on a silicon wafer. In one embodiment, said silicon wafer has a surface energy neutralizing layer polymer. In one embodiment, said surface energy neutralizing layer polymer has been deposited by spin coat treatment upon the surface of said silicon wafer. In one embodiment, the block copolymers form nanostructured materials that can be used as etch masks in lithographic patterning processes. In one embodiment, one of the blocks is polytrimethylsilylstyrene. In one embodiment, said first monomer is trimethyl-(2-methylene-but-3-enyl)silane. In one embodiment, said first monomer is a silicon-containing methacrylate. In one embodiment, said first monomer is methacryloxymethyltrimethylsilane (MTMSMA). In one embodiment, a third monomer is provided and said block copolymer is a triblock copolymer. In one embodiment, the invention relates to the etched nanostructures made according to the process described above.

In one embodiment, the invention relates to a method of applying a top coat to a block copolymer film to create a layered structure, comprising: a) providing a surface, a block copolymer, and a parylene; b) treating said surface under conditions such that a first layer on said surface is created, said layer comprising a crosslinked polymer; c) coating said first layer with block copolymer under conditions such that a second layer on said surface is created comprising a block copolymer film; and d) depositing said parylene by vacuum deposition on said second layer so as to create a third layer on said surface, said third layer comprising a top coat on said block copolymer film surface, said first, second and third layers comprising a layered structure. In one embodiment, further comprising: e) treating said layered structure under conditions such that nanostructures form. In one embodiment, said treating comprises annealing. In one embodiment, said annealing comprises heating. In one embodiment, further comprising: f) etching said layered structure under conditions such that the topcoat and part of the block copolymer is removed revealing said nanostructures. In one embodiment, said etching comprises oxygen etching. In one embodiment, said nanostructures comprise cylindrical structures, said cylindrical structures being substantially vertically aligned with respect to the plane of the surface. In one embodiment, said block copolymer is made from at least two polmers derived from at least two monomers. In one embodiment, first monomer comprises a silicon atom that can be polymerized. In one embodiment, said second monomer comprises a monomer lacking silicon that can be polymerized. In one embodiment, said nanostructures comprise cylindrical structures, said cylindrical structures being substantially vertically aligned with respect to the plane of the surface. In one embodiment, said treating comprises vacuum deposition of a polymer on said coated block copolymer film surface. In one embodiment, said polymer is a parylene. In one embodiment, said parylene is selected from the group comprising: Parylene N, Parylene D, Parylene C, Parylene HT®, and Parylene X. In one embodiment, said surface is on a silicon wafer. In one embodiment, said silicon wafer has a surface energy neutralizing layer polymer. In one embodiment, said surface energy neutralizing layer polymer has been deposited by spin coat treatment upon the surface of said silicon wafer. In one embodiment, block copolymers form nanostructured materials that can be used as etch masks in lithographic patterning processes. In one embodiment, said first monomer is trimethyl-(2-methylene-but-3-enyl)silane. In one embodiment, said first monomer is trimethylsilylstyrene. In one embodiment, said first monomer is a silicon-containing methacrylate. In one embodiment, said first monomer is methacryloxymethyltrimethylsilane (MTMSMA). In one embodiment, a third monomer is provided and said block copolymer is a triblock copolymer. In one embodiment, the invention relates to the etched nanostructures made according to the process described above. In one embodiment, the invention relates to a layered structure comprising wherein the top third layer is a parylene.

In one embodiment, the present invention discloses a method of producing a domain orientation controlled the block copolymer film, comprising: a) providing first and second monomers; b) treating said second monomer under conditions such that reactive polymer of said second monomer is formed; c) reacting said first monomer with said reactive polymer of said second monomer under conditions such that said silicon-containing block copolymer is synthesized; d) coating a surface with said block copolymer so as to create a block copolymer film; and e) treating said film under conditions such that nanostructures form. In one embodiment, said first monomer comprises a silicon atom that can be polymerized. In one embodiment, said second monomer comprises a monomer lacking silicon that can be polymerized. In one embodiment, said nanostructures comprise cylindrical structures, said cylindrical structures being substantially vertically aligned with respect to the plane of the surface. In one embodiment, said treating comprises vacuum deposition of a polymer on said coated block copolymer film surface. In one embodiment, said polymer is a poly(p-xylylene). In one embodiment, said poly(p-xylylene) is selected from the group comprising: Parylene N, Parylene D, Parylene C, Parylene HT®, and Parylene X. In one embodiment, said surface is on a silicon wafer. In one embodiment, said silicon wafer has a surface energy neutralizing layer. In one embodiment, said surface energy neutralizing layer polymer has been deposited by spin coat treatment upon the surface of said silicon wafer. In one embodiment, the block copolymers form nanostructured materials that can be used as etch masks in lithographic patterning processes. In one embodiment, one of the blocks is polytrimethylsilylstyrene. In one embodiment, said first monomer is trimethyl-(2-methylene-but-3-enyl)silane. In one embodiment, said first monomer is a silicon-containing methacrylate. In one embodiment, said first monomer is methacryloxymethyltrimethylsilane (MTMSMA). In one embodiment, a third monomer is provided and said block copolymer is a triblock copolymer. In one embodiment, the invention relates to the film made according to the process described above.

The need to overcome feature-size limitations in conventional lithography has led to the development of new patterning techniques using block copolymer templates. Ideal block copolymer systems for these applications have high etch contrast between blocks to promote good feature resolution and high chi-parameters to achieve small features. An additional desirable attribute is polymers with high silicon content such that they form a robust oxide mask during reactive ion etching with oxygen. To achieve etch contrast; these silicon-containing polymers can be incorporated into a block copolymer where the adjacent block is organic and etches easily. It is also observed that, in some cases, incorporating silicon into one of the blocks increases chi compared to similar silicon-deficient block copolymers. It is not intended that the present invention be limited to a specific silicon containing copolymers. In one embodiment, the present invention includes block copolymer systems that self-assemble into nanoscale patterns with high etch contrast.

Block copolymers used in nanoscale lithographic patterning typically self-assemble to produce structures with characteristic sizes from 10-100 nm. In one embodiment, the present invention includes block copolymers in which one of the blocks is a propargyl-functionalized, a chemically modified naturally-occurring material that enables production of very small structures. In one embodiment, the invention includes the block together with a silicon containing synthetic block, the combination of which provides very high etch selectivity. In one embodiment, the invention is a potential solution to overcoming the feature-size limitations of conventional lithography techniques involves using self-assembled block copolymers to pattern nanoscale features. Block copolymer lithography circumvents physical and cost limitations present in conventional lithography techniques. Polymers with high segregation strength can form features much smaller than those achievable by photolithography and can do so using a less time-intensive process than electron beam lithography. This process is only useful when one of the domains of the block copolymer has high resistance against dry etching. This is fairly easy to achieve by incorporation of more than 10% by weight of the element silicon into one of the blocks. In one embodiment such Silicon-Containing Block Co-Polymers are described in a Patent application PCT/US11/28867 entitled "Silicon-Containing Block Co-Polymers, Methods for Synthesis and Use" [10], herein incorporated by reference. Other elements that form refractory oxides can function in a similar fashion. It is not intended that the present invention be limited to a specific silicon-containing monomer or copolymer. Illustrative monomers are shown in FIG. 1.

In one embodiment, the silicon-containing block copolymer is applied to a surface, for example, by spin coating, preferably under conditions such that physical features, such as nanostructures that are less than 100 nm in size (and preferably 50 nm or less in size), are spontaneously formed on the surface. In one embodiment, the features have very different etch rates such that one block can be etched without substantial etching of the other. In a preferred embodiment, such nanostructures have a cylindrical morphology with the domain spacing of approximately 50 nm or less. In one embodiment, the nanostructures are hexagonally packed. Such conditions for forming nanostructures can involve annealing with heat or solvents. Alternatively, the surface can first be treated with a substance that imparts a desired surface energy such that the nature of the surface energy neutralizing layer controls or enables nanostructure development. Alternatively, the conditions can involve varying the thickness of the applied silicon-containing copolymer. However the nanostructures are made, in one embodiment, the method further comprises etching said nanostructures.

It is not intended that the present invention be limited to a specific silicon-containing monomer or copolymer. Illustrative monomers are shown in FIG. 1.

BRIEF DESCRIPTION OF THE DRAWINGS

For a more complete understanding of the features and advantages of the present invention, reference is now made to the detailed description of the invention along with the accompanying figures.

FIG. 12 shows a table of various monomers and their corresponding condensation temperatures (° C.) taken from Gorham, W. F. (1966) [11], herein incorporated by reference.

FIG. 13 shows a cartoon example of the nanostructure formation. The three-dimensional multilayered nanostructures with controlled orientation of microdomains from application of parylene and subsequent etching are shown with the topcoat etched and nanostructures are revealed after the single step etching.

DEFINITIONS

Figure 1:
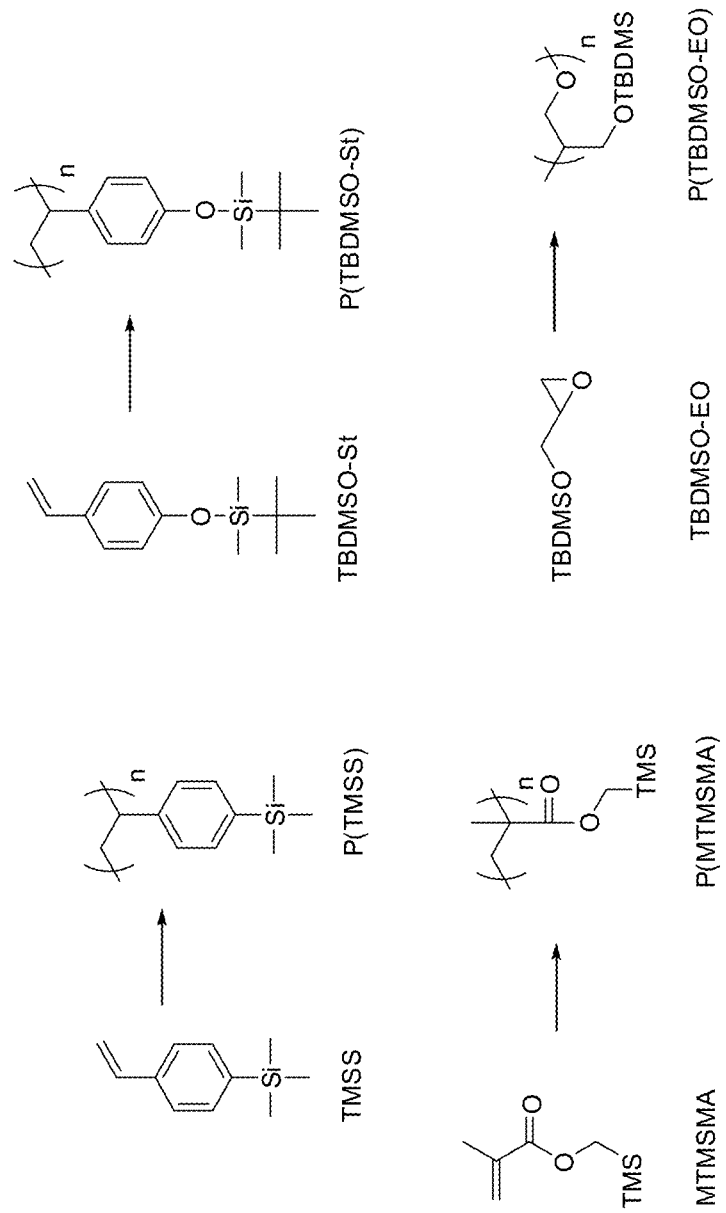
FIG. 1 shows non-limiting structures of illustrative silicon-containing monomers.
Figure 2:
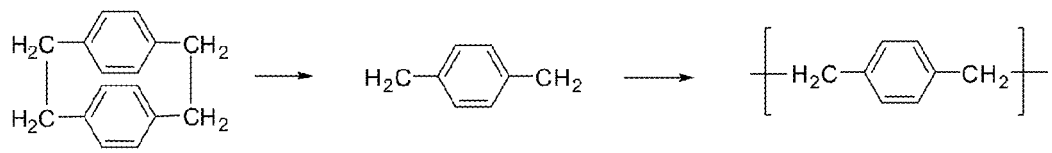
FIG. 2 shows an example of paralene polymerization, in this example the polymerization of parylene N.
Figure 3:
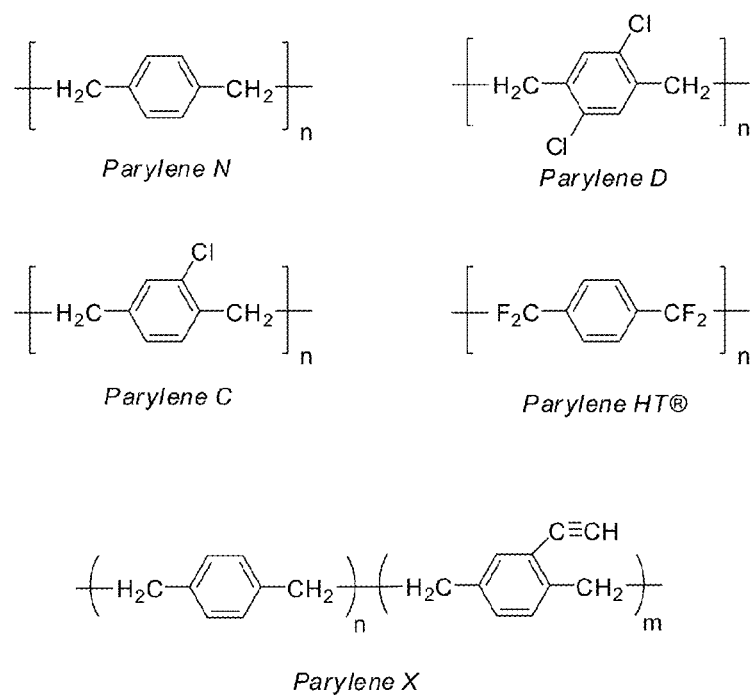
FIG. 3 shows examples of various parylene polymers: Parylene N, Parylene D, Parylene C, Parylene HT®, and Parylene X.
Figure 4:
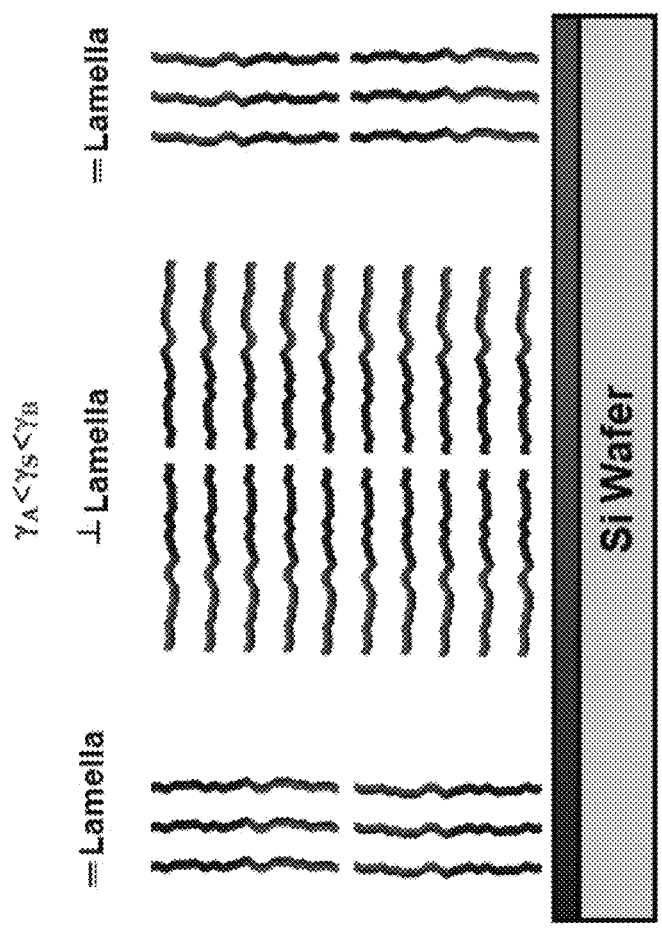
FIG. 4 shows a diagram illustrating how block copolymer lamella provide differing interfacial energies on a silicon wafer.
Figure 5:
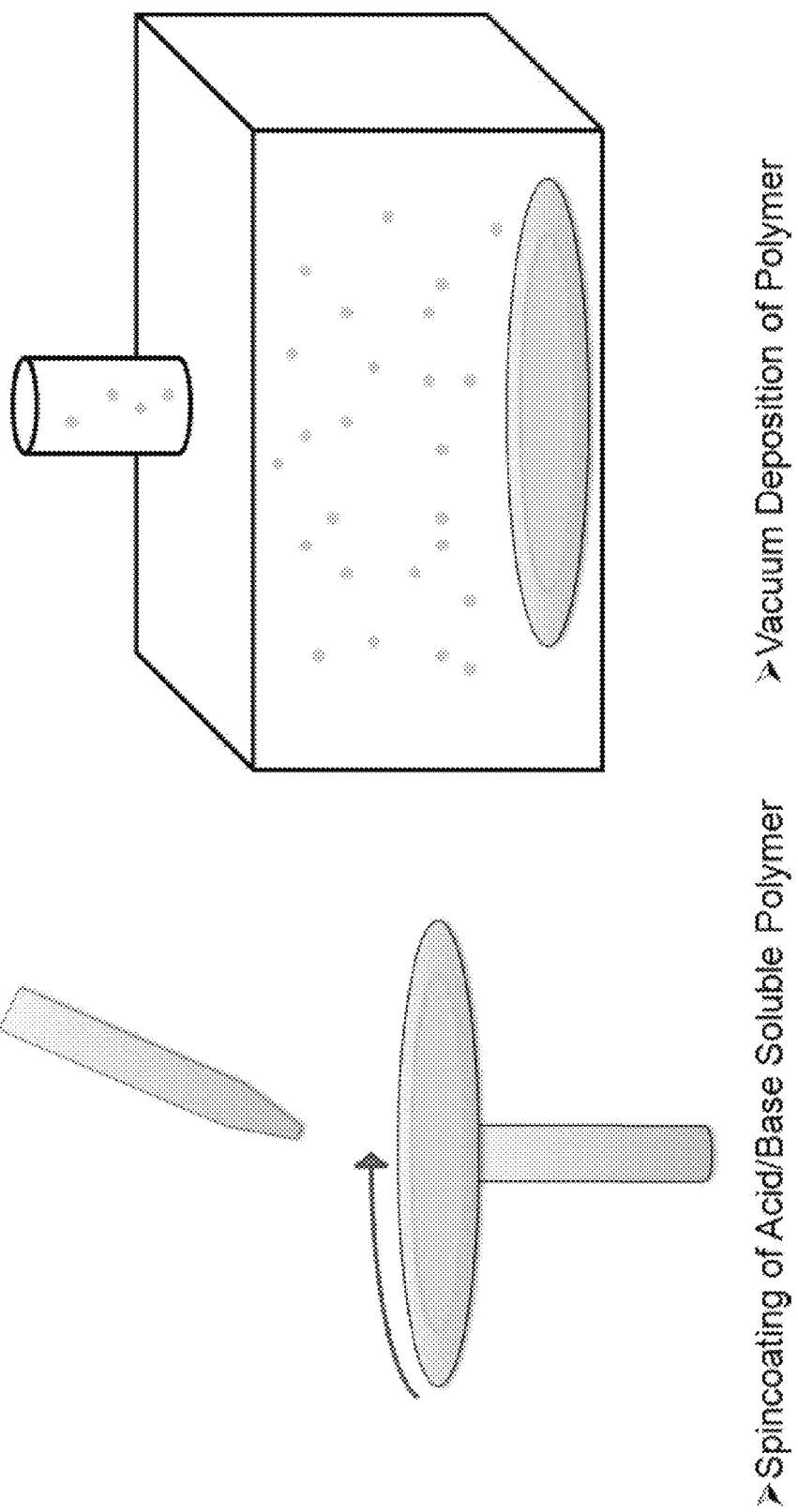
FIG. 5 shows the difference in application techniques, spincoating of an acid/base soluble polymer versus vacuum deposition of the polymer.
Figure 6:
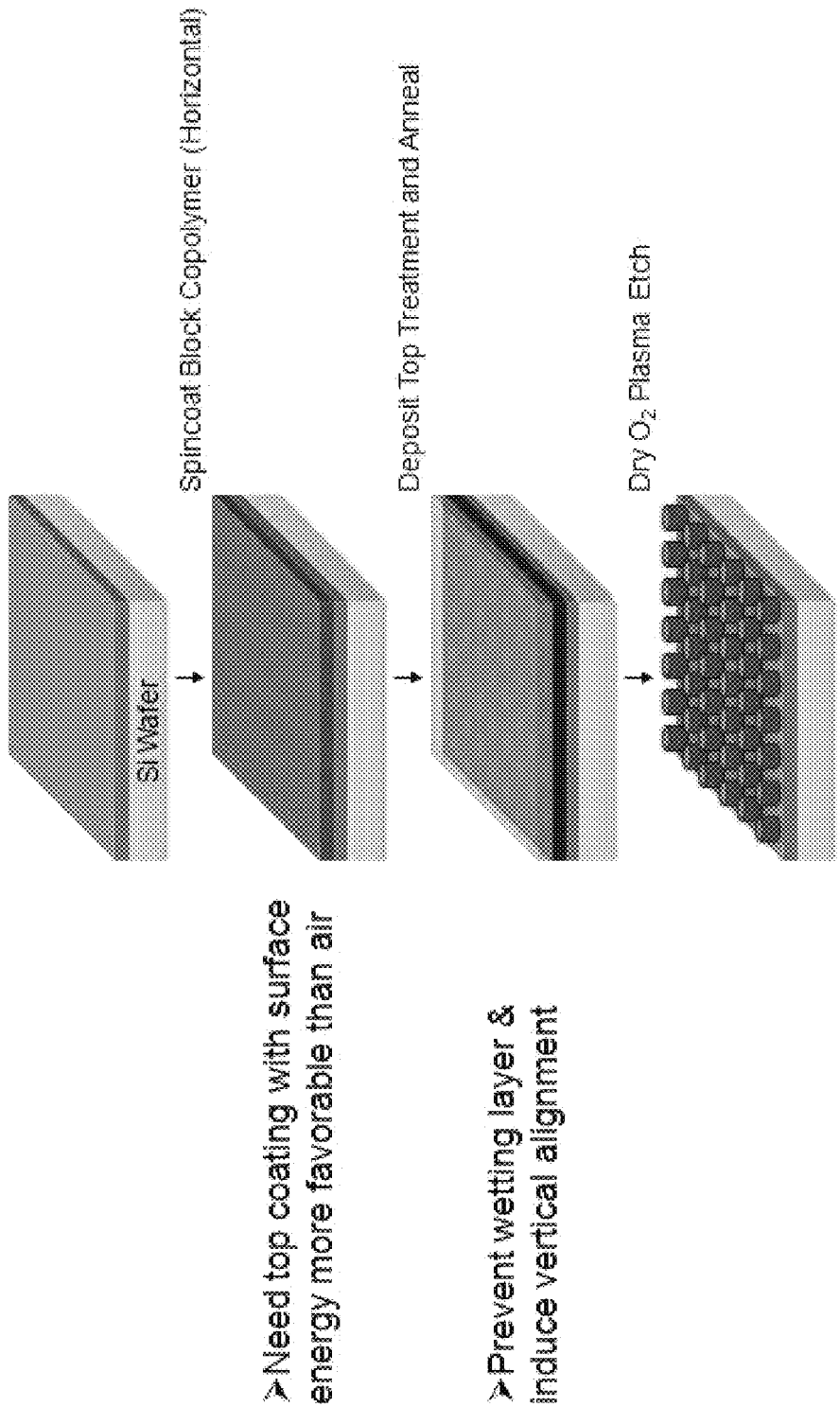
FIG. 6 show a construction diagram for the construction of a multilayered block copolymer on a silicon wafer. The horizontal spincoat block copolymer is applied with a surface energy more favorable than air, then a top treatment is deposited and annealed preventing wetting layer and inducing vertical alignment, finally the coated water is dry $O_2$ plasma etched to produce the product.
Figure 7:
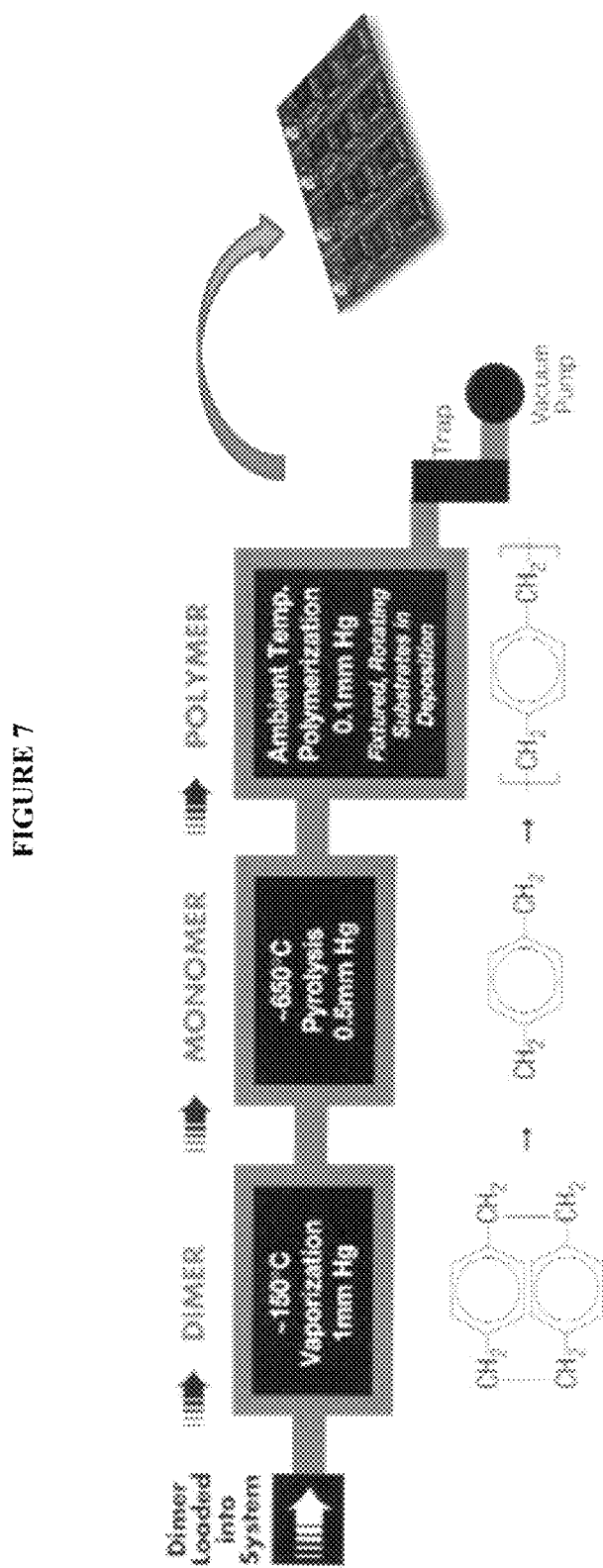
FIG. 7 shows the process of vacuum deposition of a [2.2]paracyclophane starting material based polymer onto a silicon wafer product.
Figure 8:
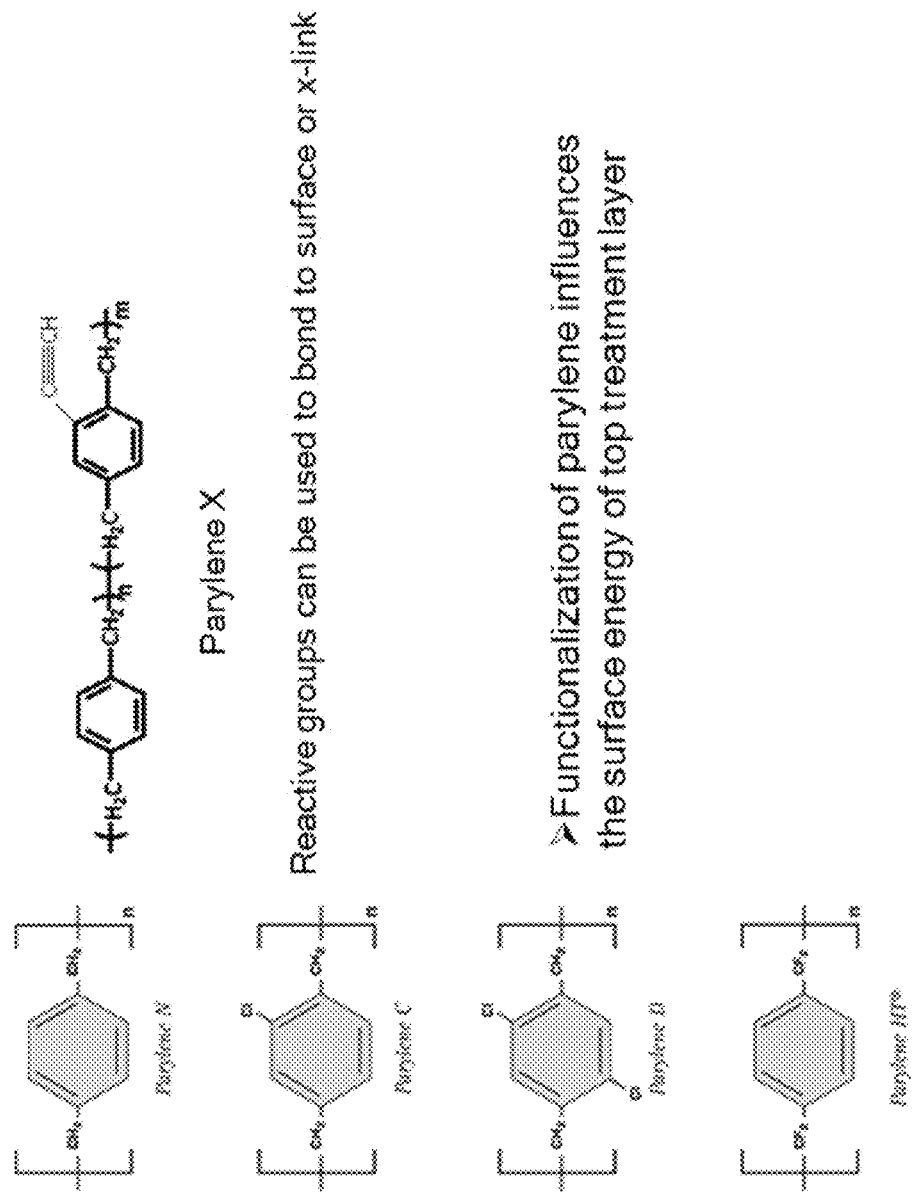
FIG. 8 shows various example parylene monomer units (Parylene N, Parylene D, Parylene C, Parylene HT®, and Parylene X) that could be used to produce vacuum-deposited surfaces on block copolymers. The various reactive groups would affect the physical properties (including the surface energy) of the vacuum deposited top treatment layer.
Figure 9:
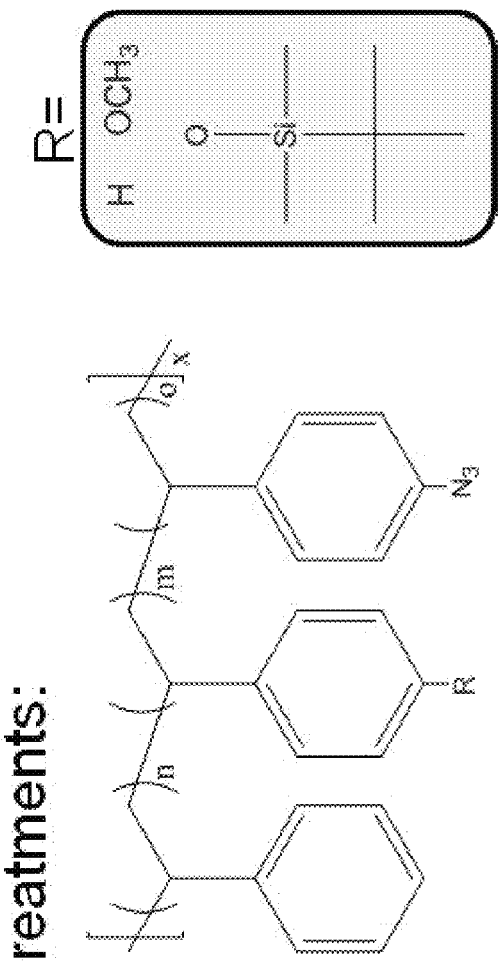
FIG. 9 shows a three random copolymer surface energy neutralizing layers.
Figure 10:
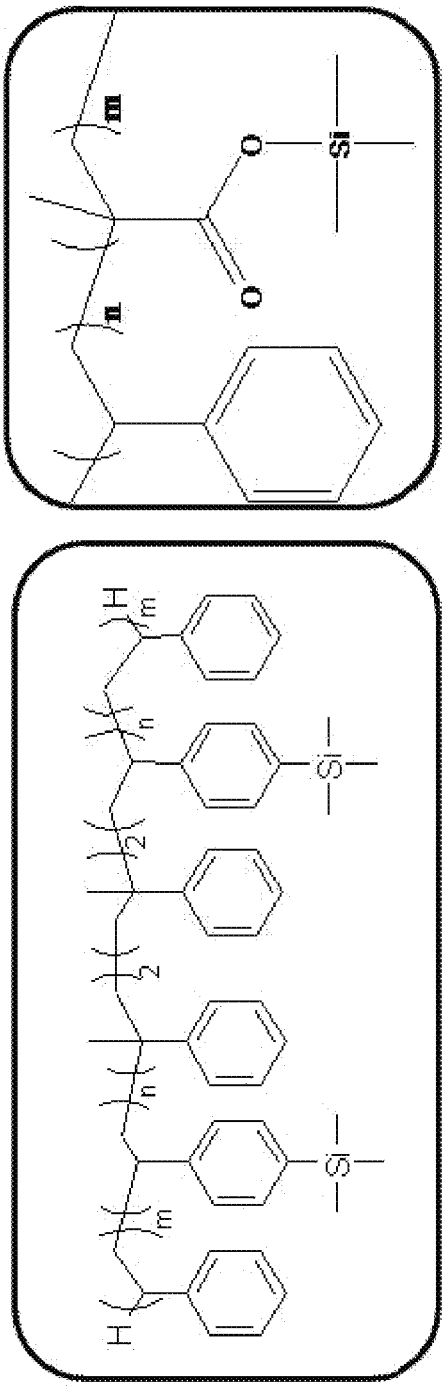
FIG. 10 describes different types of copolymers, such as TMSS-Sty and MTMSMA-Sty, which can be made to arrange in lamellae and cylinders in several thicknesses.
Figure 11:
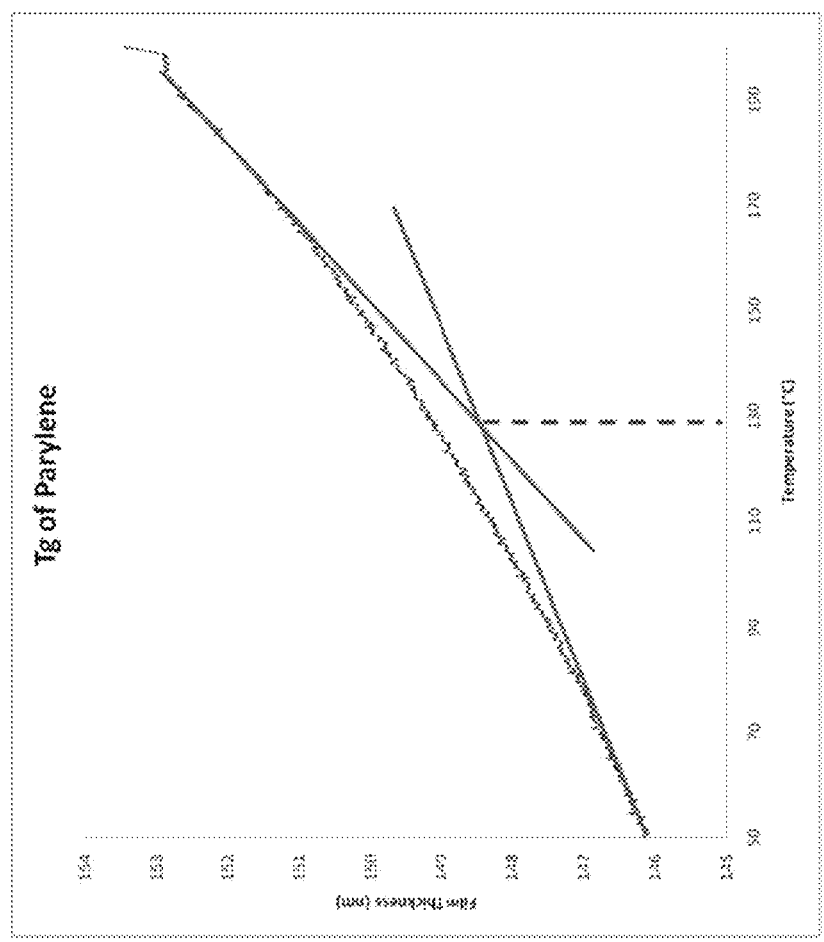
FIG. 11 shows a graph of parylene film thickness versus temperature ° C. in deposition.
Figure 14:
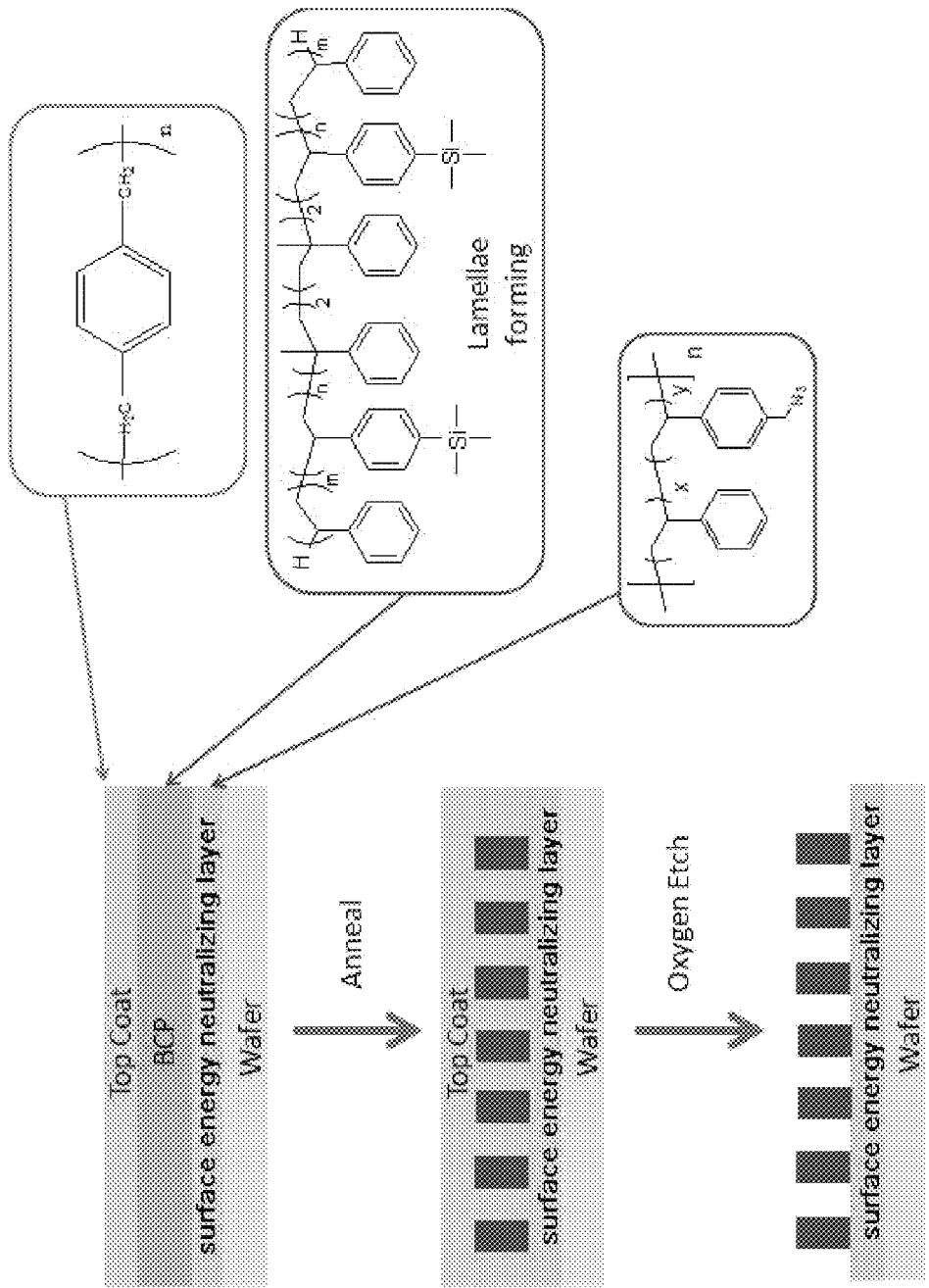
FIG. 14 shows the processing to thin films of copolymer films with whose block copolymer control domain orientation is determined by vapor deposited film and annealing before oxygen etching.

To facilitate the understanding of this invention, a number of terms are defined below. Teens defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

In addition, atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}C$ and $^{14}C$. Similarly, it is contemplated that one or more carbon atom(s) of a compound of the present invention may be replaced by a silicon atom(s). Furthermore, it is contemplated that one or more oxygen atom(s) of a compound of the present invention may be replaced by a sulfur or selenium atom(s).

The block copolymer or blend thereof can be cross-linked by any convenient method. In one embodiment the block copolymer or blend thereof is deposited as a film or coating and then cross-linked using UV light or ionizing radiation. If necessary, free radical initiators or prorads may be added to the block copolymer or blend thereof in order to assist the cross-linking reaction. Preferably, however, the block copolymer or blend thereof comprises a cross-linking agent, especially when the block copolymer or blend thereof is used in a film-forming or coating composition. Preferably, the cross-linking agent and concentration of cross-linking agent are chosen such that the rate constant of the crosslinking reaction is relatively slow, thereby giving a relatively long pot life for the film-forming or coating composition. This is particularly important when the film-forming composition or coating composition is to be used as a printing ink or deposited using ink jet printing technology. Preferably, the rate constant of the cross-linking reaction is such that the speed of cross-linking is slower than the speed of self-assembly of the block copolymer or blend thereof.

As used herein, Glass transition temperature is represented by the abbreviation $T_g$, Vitrification occurs when the glass transition temperature, $T_g$, rises to the isothermal temperature of cure, as described in Gillham, J. K. (1986) [12].

As used herein, silylating agents (also known as silanes or self-assembled monolayers) refer to organosilicon compounds with methoxy, ethoxy, or halide functionalities. Some non-limiting examples include methyldichlorosilane, methyldiethoxysilane, allyl(chloro)dimethylsilane, and (3-amniopropyl) triethoxysilane.

As used herein, brush polymers are a class of polymers that are adhered to a solid surface [13]. The polymer that is adhered to the solid substrate must be dense enough so that there is crowding among the polymers which then, forces the polymers to stretch away from the surface to avoid overlapping. [14]

In the field of electronic devices, Roll-to-roll processing, also known as web processing, reel-to-reel processing or R2R, is the process of creating electronic devices on a roll of flexible plastic or metal foil. In other fields predating this use, it can refer to any process of applying coatings, printing, or performing other processes starting with a roll of a flexible material and re-reeling after the process to create an output roll. A thin-film solar cell (TFSC), also called a thin-film photovoltaic cell (TFPV), is a solar cell that is made by depositing one or more thin layers (thin film) of photovoltaic material on a substrate substrate or surface. Possible roll-to-roll substrates include, but are not limited to metalized polyethylene terphthalate, metal film (steel), glass films (e.g. Corning Gorilla Glass), graphene coated films, polyethylene naphthalate (Dupont Teonex), and Kapton film, polymer films, metalized polymer films, glass or silicon, carbonized polymer films, glass or silicon. Possible polymer films include polyethylene terephthalate, kapton, mylar, etc.

As used herein, a block copolymer consists of two or more polymeric chains (blocks), which are chemically different and covalently attached to each other. Block copolymers are being suggested for many applications based primarily on their ability to form nanometer scale patterns. These self-assembled patterns are being considered as nanolithographic masks as well as templates for the further synthesis of inorganic or organic structures. Such applications are made possible by taking advantage of contrasts in chemical or physical properties that lead to differential etch rates or attractions to new materials. New applications in, for example, fuel cells, batteries, data storage and optoelectronic devices generally rely on the inherent properties of the blocks. All of these uses depend on the regular self-assembly of block copolymers over macroscopic distances.

Trimethyl-(2-methylene-but-3-enyl)silane is represented by the following structure:

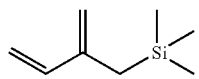

and abbreviated (TMSI) and whose polymeric version is

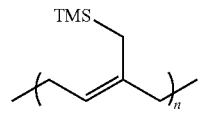

and is abbreviated P(TMSI).

Trimethyl(4-vinylphenyl)silane is another example of a styrene derivative and is represented by the following structure:

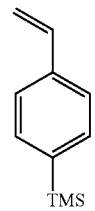

and abbreviated TMS-St and whose polymeric version is

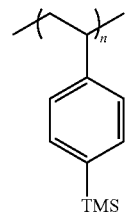

and is abbreviated P(TMS-St).

Tert-butyldimethyl(4-vinylphenoxy)silane is another example of a styrene derivative and is represented by the following structure:

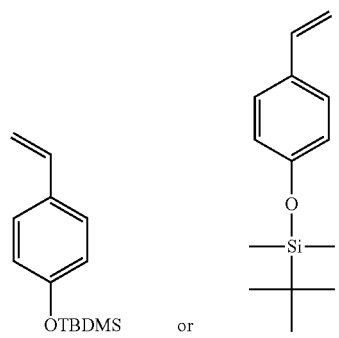 [SMILES: C=Cc1ccc(O[Si](C)(C)C(C)(C)C)cc1 ; "or" ; C=Cc1ccc(O[Si](C)(C)C(C)(C)C)cc1]

and abbreviated TBDMSO-St and whose polymeric version is

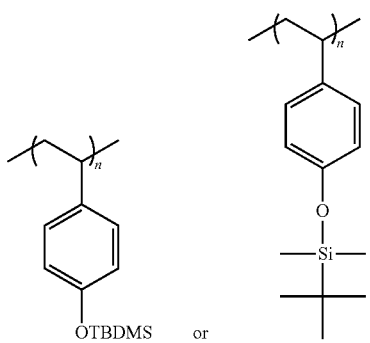

and is abbreviated P(TBDMSO-St).

Tert-butyldimethyl(oxiran-2-ylmethoxy)silane is an example of a silicon containing compound and is represented by the following structure:

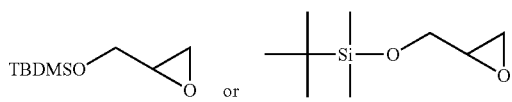

and is abbreviated TBDMSO-EO and whose polymeric version is

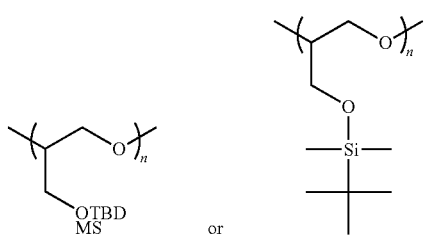

and is abbreviated P(TBDMSO-EO).

Methacryloxymethyltrimethylsilane is represented by the following structures:

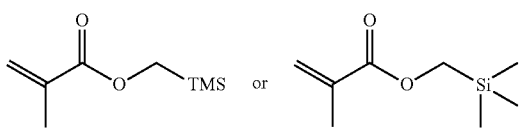

and abbreviated (MTMSMA) and whose polymeric version is

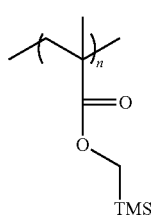

and is abbreviated P(MTMSMA).

In one embodiment, TMSS-Sty is represented by the following structure:

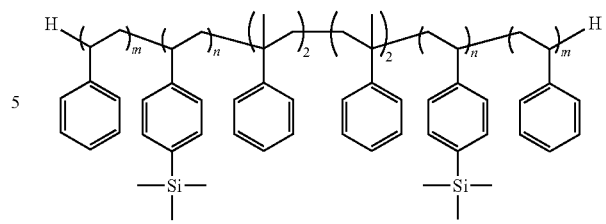

In one embodiment, the polymer MTMSMA-Sty is represented by the following structure:

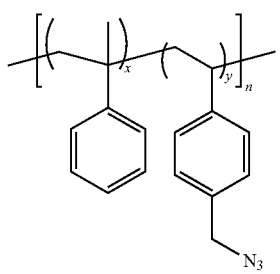

In one embodiment, the random copolymer surface energy neutralizing layer polymer is represented by the following structure:

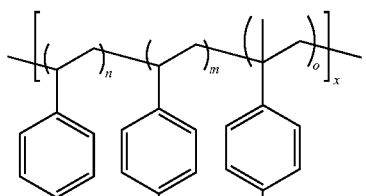

In one embodiment, is an example of a 3 random copolymer surface energy neutralizing layer polymer.

The present invention also contemplates styrene "derivatives" where the basic styrene structure is modified, e.g. by adding substituents to the ring. Derivatives of any of the compounds shown in FIG. 1 can also be used. Derivatives can be, for example, hydroxy-derivatives or halo-derivatives. As used herein, "hydrogen" means —H; "hydroxy" means —OH; "oxo" means =O; "halo" means independently —F, —Cl, —Br or —I.

Parylene is the name for a variety of chemical vapor deposited poly(p-xylylene) polymers. One non-limiting example of a parylene polymer is shown in the following generic structure:

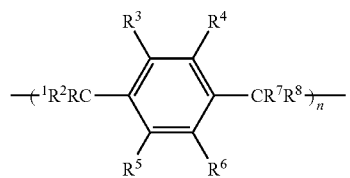

wherein $R^1$-$R^8$ can be any of a number of functional groups. The simplest example is

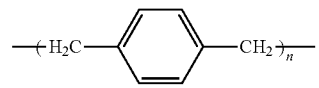

In one embodiment, Parylene N is shown in the following structure:

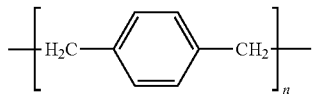

In one embodiment, Parylene D is shown in the following structure:

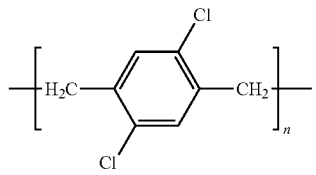

In one embodiment, Parylene C is shown in the following structure:

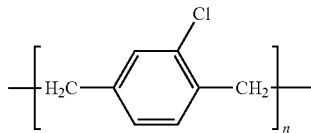

In one embodiment, Parylene HT® is shown in the following structure:

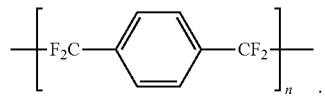

In one embodiment, Parylene X is shown in the following structure:

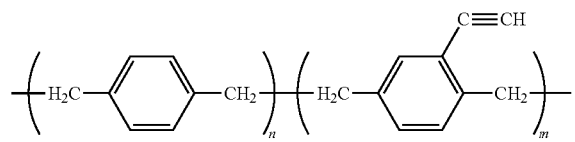

Parylene is green polymer chemistry. It is self-initiated (no initiator needed) and un-terminated (no termination group needed) with no solvent or catalyst required. The commonly used precursor, [2.2]paracyclophane, yields 100% polymer above 550° C. in vacuum [15] and the initiator and does not yield any by-products. That said there are alternative precursors to arrive at the parylene polymers that possess leaving groups as opposed to the cyclophane precursor.

[2.2]paracyclophane is represented by the chemical structure:

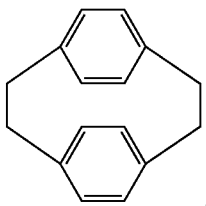

Generically the parylene precursion can be represented by the chemical structure:

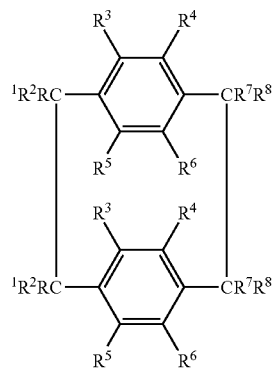

wherein $R^1$-$R^8$ can be any of a number of functional groups. [2.2]paracyclophane represents the simplest example of such parylene precursor molecules.

The Parylene deposition process is generally carried out in a closed system under negative pressure. Parylene polymers are deposited from the vapor phase by a process that resembles vacuum metalizing, however, the Parylenes are formed at around 0.1 Torr. The first step is the vaporization of the solid Parylene dimer at approximately 150° C. in the vaporization chamber. The second step is the quantitative cleavage (pyrolysis) of the dimer at the two methylene-methylene bonds at about 680° C. in the pyrolysis chamber to yield the stable monomer diradical, para-xylylene. Finally, the monomer in gas form enters the room temperature deposition chamber where it simultaneously absorbs and polymerizes on the object to be coated. The closed system generally has separate chambers for the vaporization, pyrolysis and deposition of the Parylene, with the chambers being connected with the appropriate plumbing or tubular connections.

Apparatus for chemical vapor deposition of Parylene onto objects are known in the art. See for example, U.S. Pat. Nos. 4,945,856 [16], 5,078,091 [17], 5,268,033 [18], 5,488,833 [19], 5,534,068 [20], 5,536,319 [21], 5,536,321 [22], 5,536,322 [23], 5,538,758 [24], 5,556,473 [25], 5,641,358 [26], 5,709,753 [27], 6,406,544 [28], 6,737,224 [29], all of which are incorporated by reference herein.

For scientific calculations, room temperature (rt) is taken to be 21 to 25 degrees Celsius, or 293 to 298 kelvins (K), or 65 to 72 degrees Fahrenheit.

DETAILED DESCRIPTION OF THE INVENTION

The present invention uses vacuum deposited thin films of material to create an interface that non-preferentially interacts with different domains of an underlying block copolymer film. The non-preferential interface prevents formation of a wetting layer and influences the orientation of domains in the block copolymer. The purpose of the deposited polymer is to produce nanostructured features in a block copolymer film that can serve as lithographic patterns.

In one embodiment, the present invention uses well-known vacuum deposition process to produce conformal thin films of organic material to create a surface that interacts non-preferentially with different blocks of an underlying block copolymer film. In one embodiment, the non-preferential interface interaction influences the domain orientation of the block copolymer film and prevents the formation of a low surface energy wetting layer. In one embodiment, the purpose of the deposited polymer is to produce nanostructured features in a block copolymer film that can be exploited to produce lithographic patterns. In one embodiment, chemical vapor deposited polymers analogous to poly(p-xylylene) can be used to create a non-preferential interface that influences the domain orientation of block copolymer films.

Poly(p-xylylene) polymers are well known and used for sealing and passivation of surfaces. They are formed by heating a precursor material, commonly [2.2]paracyclophane, in vacuum to high temperatures. The resulting reactive components are deposited at room temperature, forming conformal, dense, and homogenous thin films without the use of solvent. In one embodiment, the interfacial energy of the poly(p-xylylene) polymers and their glass transition temperature and mechanical properties can be varied by introducing various chemical substituents into the precursor material.

Typical polymeric thin films are created by spin coating solutions of polymeric materials Since the ideal top coat has physical properties very similar to the block copolymer domains, it is difficult to find a solvent that can be used for spin coating that does not interact with at least one of the domains of the block copolymer. This is not a concern with vapor deposited materials such as poly(p-xylelene).

There are many applications for block-copolymers that exploit their ability to spontaneously form ordered domains. It is well understood that to achieve very small domains the constituents of the block co-polymer must have very different interaction parameters. The "chi" value of the blocks must be large. When chi value is large, it becomes difficult to orient cylinders and lamellae and the block co-polymer films tend to form "wetting layers" parallel to the substrate that enable the lowest surface energy block to maximize its interaction with air. Perpendicular orientation of block copolymer domains is required for the application of block copolymers to next-generation lithography. Perpendicular orientation can be achieved by matching interfacial interactions at the top and bottom interfaces of a block copolymer thin film. The interfacial interactions can be controlled by using chemical vapor deposited materials such as poly(p-xylylene) polymers to modify the surface energy of the block copolymer interface.

The current invention possesses advantages over current technologies. Interfacial interactions have been shown to be balanced or removed by using thin films of random copolymers, consisting of monomeric units similar to the self-assembling block copolymer. However, the random copolymers cannot be deposited on the top surface by traditional spin-coating procedures due to solvent degradation of the underlying films. Vacuum deposition avoids the use of harmful solvents by physically depositing the reactive components. Poly(p-xylylene) polymers can be deposited by chemical vapor deposition, and a non-preferential surface can be created by altering chemical substituents of the polymer precursor. Furthermore, the poly(p-xylylene) polymeric films can be removed using a dry etch, removing the need for potentially harmful solvents.

Typical poly(p-xylylene) polymers have a low glass-transition temperature, which could lead to interdiffusioin between polymer layers. This can be overcome by incorporating crosslinking functional groups within the polymer structure. This process is only useful when one of the domains of the block copolymer has high resistance against dry etching. This is fairly easy to achieve by incorporation of more than 10% by weight of the element silicon into one of the blocks.

Thus, in one embodiment, the present invention contemplates utilizing the vapor deposition approach described herein with silicon containing compositions, methods of synthesis, production, and methods of use. More specifically, the present invention contemplates depositing parylene type polymers, in one embodiment, to a block copolymer derived from two (or more) monomeric species, at least one of which comprising silicon and the method of treating block copolymers so that nanostructures comprising cylindrical structures being substantially vertically aligned with respect to the plane of the surface are formed. Such compositions have many uses including multiple applications in the semiconductor industry including making templates for nanoimprint lithography and applications in biomedical applications. In one embodiment such Silicon-Containing Block Co-Polymers are described in a Patent application PCT/US11/28867 entitled "Silicon-Containing Block Co-Polymers, Methods for Synthesis and Use" [10], herein incorporated by reference. Other elements that form refractory oxides can function in a similar fashion.

Figure 15:
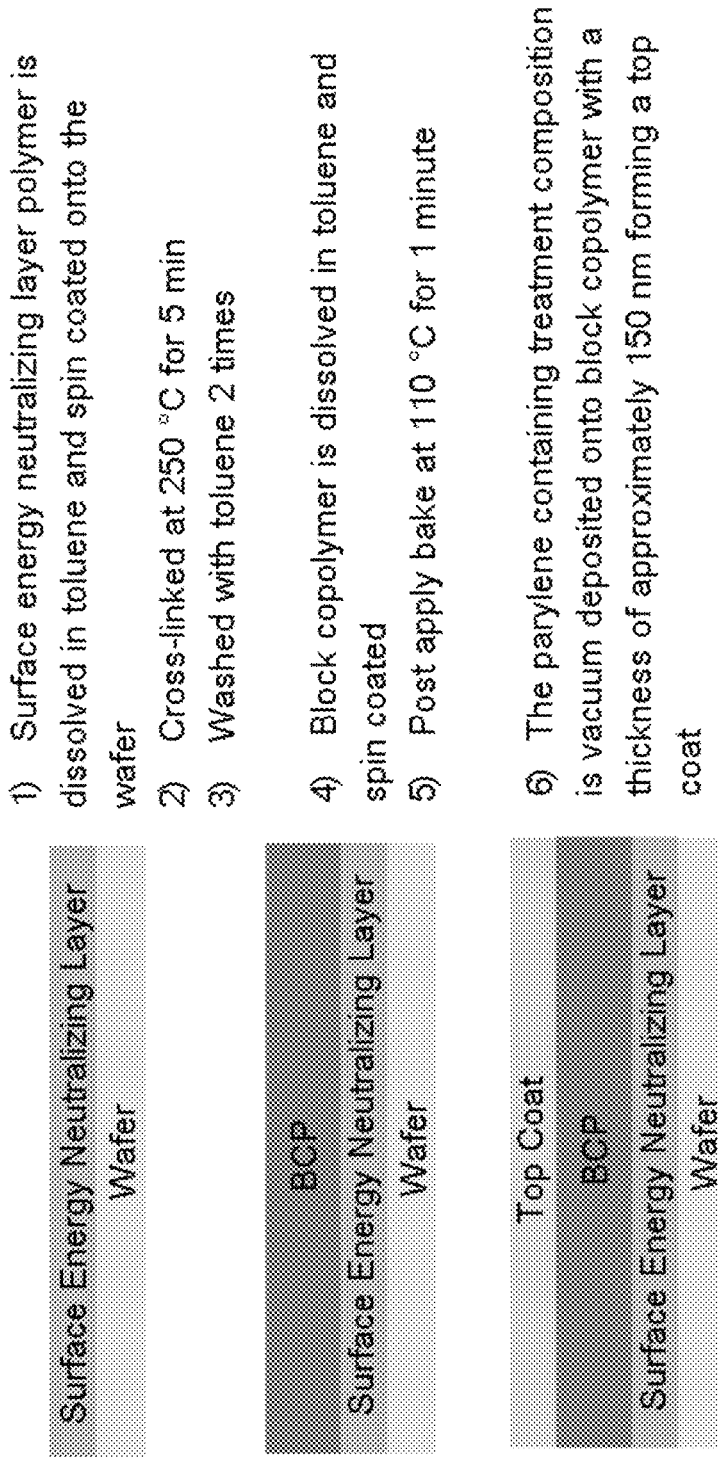
FIG. 15 shows a diagram of the construction process for the creation of the layers to be subsequently processed for orientation.
Figure 16:
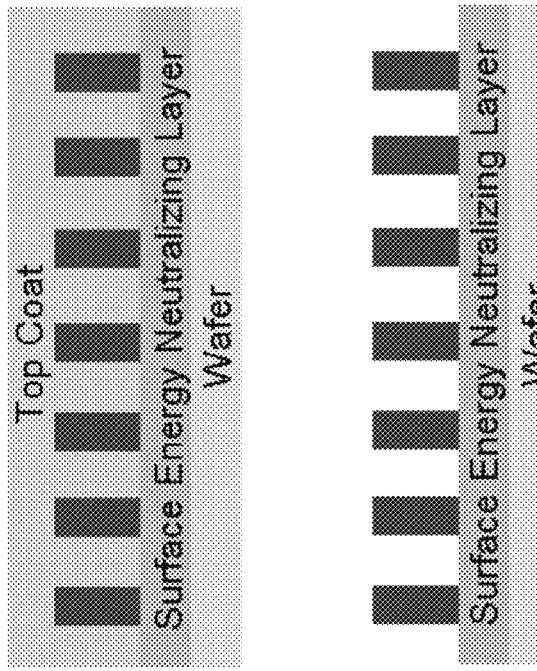
FIG. 16 shows a diagram of the annealing of the thin film to produce the desired block copolymer orientation and subsequent oxygen plasma etching of the block copolymer under the described conditions (Pressure=90 mTorr, RF Power=80 W, ICP Power=100 W, $O_2$ flow rate=5 standard cubic centimeters per minute (SCCM), temperature=15° C., time=35 seconds).
Figure 17:
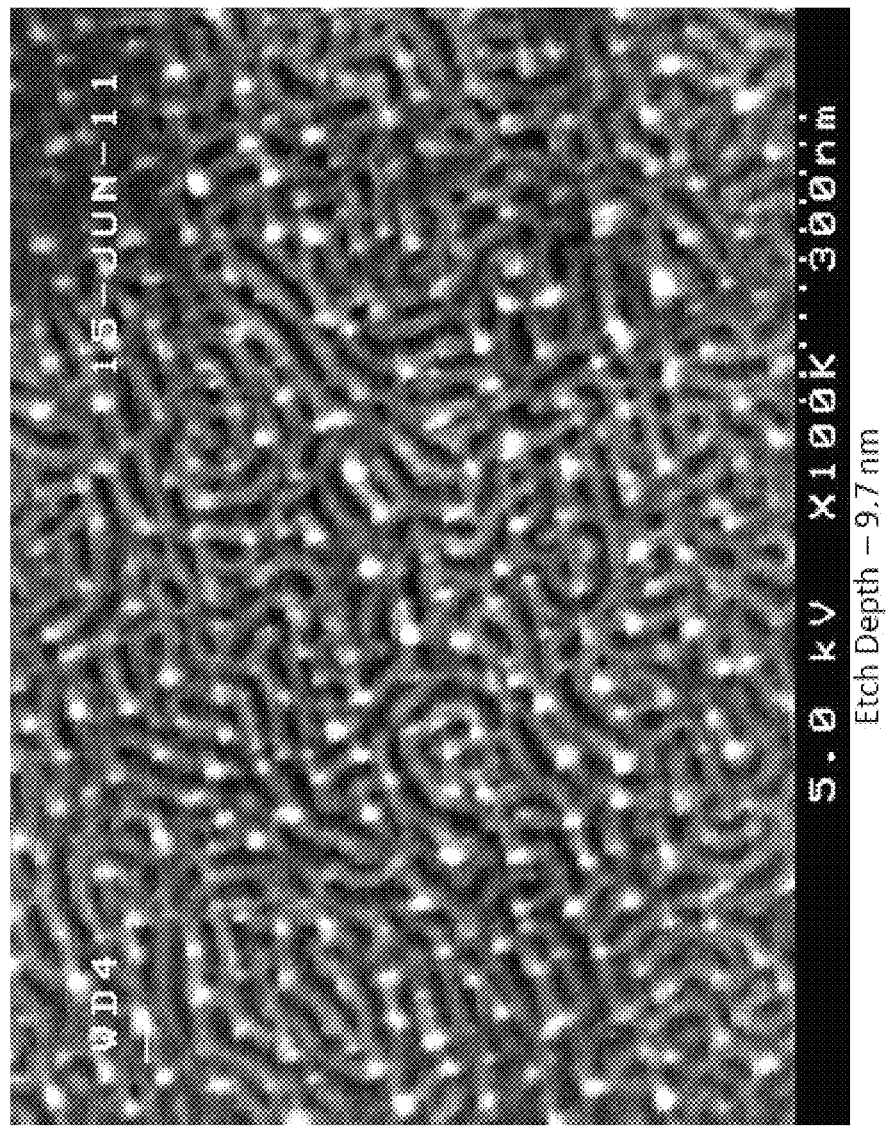
FIG. 17 shows transmission electron microscope image of an etched thin film with the desired orientation. The etch depth was 9.7 nanometers.
Figure 18:
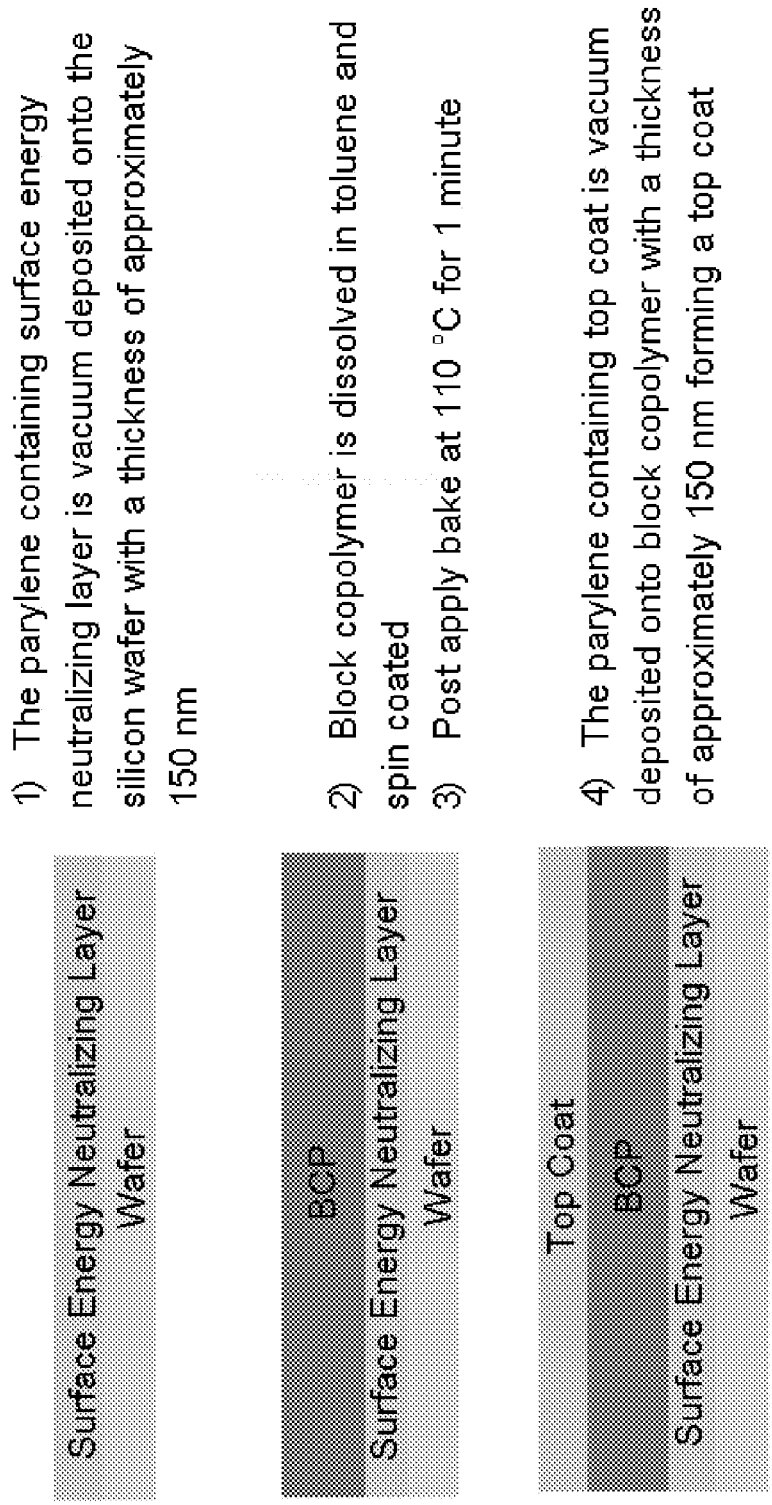
FIG. 18 shows a diagram of an alternate construction process for the creation of the layers to be subsequently processed for orientation. Here a vapor deposited parylene surface energy neutralizing layer coats the silicon wafer is used instead of the surface energy neutralizing layer described previously, such as in FIG. 15.
Figure 19:
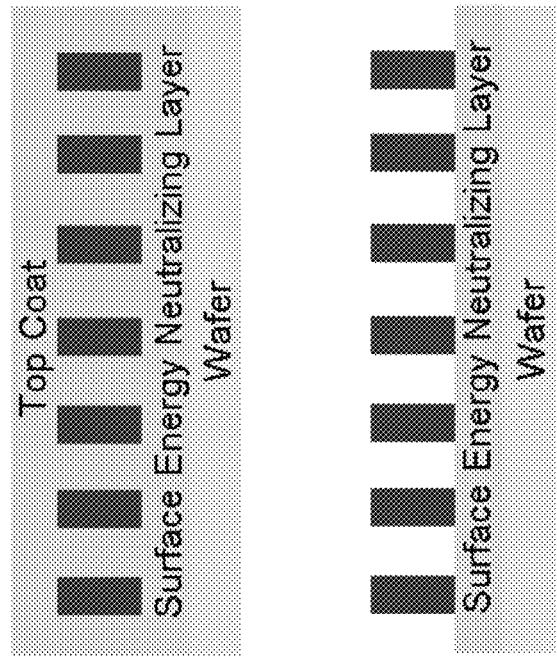
FIG. 19 shows a diagram of the annealing of the thin film to produce the desired block copolymer orientation and subsequent oxygen plasma etching of the block copolymer under the described conditions (Pressure=90 mTorr, RF Power=80 W, ICP Power=100 W, $O_2$ flow rate=5 standard cubic centimeters per minute (SCCM), temperature=15° C., time=35 seconds).

The present invention involves the use of copolymer top coats that can be vapor deposited onto block copolymer thin films and used to control the interfacial energy of the top coat-block copolymer interface (as shown in FIG. 15 and FIG. 16) or vapor deposited bottom and top surface treatments as shown in FIG. 18 & FIG. 19, can be used to control block copolymer substrate interfacial energy. The parylene derived top coats and surface energy neutralizing layers can change surface energy once they are deposited onto the block copolymer thin film. The use of self-assembled block copolymers to produce advanced lithographic patterns relies on their orientation control in thin films. Top coats potentially allow for the facile orientation control of block copolymers which would otherwise be quite challenging.

In the thin film state, the block copolymer nanodomain formation takes place relative to the surfaces of the film. The nanodomains tend to form with a particular orientation to the substrate surface. In the case of shapes with a long axis (e.g. cylinders and lamellae), the orientation of the long axis with the surface is a major characteristic of the film. Cylinders lying parallel to the surface and lamellae standing perpendicular may each be of interest in the patterning of nanowires. Upright cylinders, lamellae and spheres may be of interest in the patterning of arrays for use, for example, in data storage. In nature, gyroid structures are found in certain block copolymers. In the polymer phase diagram, the gyroid phase is between the lamellar and cylindrical phases.

For nanomanufacturing applications such as microelectronics, solar cells, and membranes, thin films with cylindrical or lamellar domains aligned perpendicular to a substrate surface are most attractive [30, 31]. BC thin film behavior has been studied by many researchers [32-34], and a recent review [30] has highlighted the importance of film thickness and interfacial interactions in dictating the BC orientation. One method of inducing cylinder or lamellar domains to orient perpendicular to the substrate is by treating the substrate with a surface modification agent such that the surface has an interfacial energy between that of each block. This type of substrate surface has been termed "neutral" because the enthalpic penalty for each block to establish contact with the substrate is approximately equal [32]. If this condition is not appropriately met, the cylinders or lamellae will usually lie parallel to the substrate with the block that most prefers the surface wetting the substrate [35]. In one embodiment, any application which requires the use of interfacial energy control could potentially benefit from the use of a top coat which changes surface energy after application of the top coat or other layers that interact with the block-copolymers, hereafter referred to as a surface energy neutralization layer. In one embodiment, copolymer top coats provide a protective coating to serve as a surface modification agent, but also minimize the air-polymer interface.

It is desired that the block copolymer be used to create "nanostructures" on a surface, or "physical features" with controlled orientation and that the top coat does not interrupt the underlying film. These physical features have shapes and thicknesses. The current invention should not be limited by the type of block copolymer utilized. For example, various structures can be formed by components of a block copolymer, such non-limiting examples as vertical lamellae, in-plane cylinders, network structures, sphere, gyroid structures, and vertical cylinders, and may depend on film thickness, surface energy neutralizing layer polymer, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nano- structures is approximately 50 nm or less. In a preferred embodiment, said cylindrical structures are controlled by the deposition of a polymer topcoat and aligned in an annealing process. The methods described herein can generate structures with the desired size, shape, orientation, and periodicity. Thereafter, in one embodiment, these structures may be etched or otherwise further treated.

The present invention provides advantages over current technologies. To produce the desired perpendicular orientation of block copolymer domains in thin films, the bottom and top interfaces generally must have an interfacial energy intermediate to the surface energy of the two block copolymer domains. Current technologies have started to discuss the use of water-soluble polymers as top coats, because they can be spin coated onto hydrophobic block copolymers without destroying the block copolymer thin film. However, the main problem with water soluble polymers is that they are polar, which inherently means they have high surface energies and are thus likely to have a surface energy which is too high and does not fall in the range required to produce perpendicular block copolymer features. The present invention overcomes these problems by having a vapor deposited polymer as the top coat.

Previous developments in this area are described in a Japanese Patent Application JP 2010-115832A entitled "Method for Promoting Self-Formation of Block Copolymer and Method for Forming Self-Formation Pattern of Block Copolymer Using the Method for Promoting Self-Formation" [36], herein incorporated by reference and U.S. Application Endou, M. and Sasago, M. "Method of Accelerating Self-Assembly of Block Copolymer and Method of Forming Self-Assembled Pattern of Block Copolymer Using the Accelerating Method," United States Patent Application 20110186544 application Ser. No. 13/085,954, filed Apr. 13, 2011. (Published Aug. 4, 2011) [37], herein incorporated by reference.

It is desired that the block copolymer be used to create "nanostructures" on a surface, or "physical features" with controlled orientation. These physical features have shapes and thicknesses. For example, various structures can be formed by components of a block copolymer, such as vertical lamellae, in-plane cylinders, and vertical cylinders, and may depend on film thickness, surface energy neutralizing layer, and the chemical properties of the blocks. In a preferred embodiment, said cylindrical structures being substantially vertically aligned with respect to the plane of the first film. Orientation of structures in regions or domains at the nanometer level (i.e. "microdomains" or "nanodomains") may be controlled to be approximately uniform, and the spatial arrangement of these structures may also be controlled. For example, in one embodiment, domain spacing of the nanostructures is approximately 50 nm or less. In a preferred embodiment, said cylindrical structures are controlled by the deposition of a polymer topcoat and aligned in an annealing process. The methods described herein can generate structures with the desired size, shape, orientation, and periodicity. Thereafter, in one embodiment, these structures may be etched or otherwise further treated.

In one embodiment, any application which requires the use of interfacial energy control could potentially benefit from the use of a top coat which changes surface energy after application of the top coat.

Block copolymers used in nanoscale lithographic patterning typically self-assemble to produce structures with characteristic sizes from 10-100 nm. In one embodiment, the invention includes the block together with a silicon containing synthetic block, the combination of which provides very high etch selectivity. In one embodiment, the invention is a potential solution to overcoming the feature-size limitations of conventional lithography techniques involves using self-assembled block copolymers to pattern nanoscale features. Block copolymer lithography circumvents physical and cost limitations present in conventional lithography techniques. Polymers with high segregation strength can form features much smaller than those achievable by photolithography and can do so using a less time-intensive process than electron beam lithography.

Thus, specific compositions and methods of Using Chemical Vapor Deposited Films to Control Domain Orientation in Block Copolymer Thin Films have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

EXAMPLES

Example 1

Using Chemical Vapor Deposited Films to Control Domain Orientation in Block Copolymer Thin Films One example of the method of using chemical vapor deposited films to control domain orientation in block copolymer thin films: 1) Surface energy neutralizing layer polymer is dissolved in toluene and spin coated, 2) Cross-linked at 250° C. for 5 minutes, 3) Washed with toluene 2 times, 4) Block copolymer is dissolved in toluene and spin coated, 5) Post apply bake at 110° C. for 1 minute, 6) The parylene containing treatment composition is vacuum deposited onto block copolymer with a thickness of approximately 150 nm forming a top coat, 7) Anneal the thin films at 170° C. for 18 hours, 8) Oxygen plasma etch the block copolymer with the following conditions: Pressure=90 mTorr, RF Power=80 W, ICP Power=100 W, $O_2$ flow rate=5 standard cubic centimeters per minute (SCCM), temperature=15° C., time=35 seconds.

See FIG. 15 and FIG. 16.

Example 2

An Alternate Procedure Using Two Chemical Vapor Deposited Layers to Control Domain Orientation in Block Copolymer Thin Films One example of the method of using chemical vapor deposited films to control domain orientation in block copolymer thin films: 1) The parylene containing surface energy neutralizing layer is vacuum deposited onto the wafer, 2) Block copolymer is dissolved in toluene and spin coated, 3) Post apply bake at 110° C. for 1 minute, 4) The parylene containing treatment composition is vacuum deposited onto block copolymer with a thickness of approximately 150 nm forming a top coat, 5) Anneal the thin films at 170° C. for 18 hours, 6) Oxygen plasma etch the block copolymer with the following conditions: Pressure=90 mTorr, RF Power=80 W, ICP Power=100 W, $O_2$ flow rate=5 standard cubic centimeters per minute (SCCM), temperature=15° C., time=35 seconds.

See FIG. 18 and FIG. 19.

REFERENCES

1. Ross, C. A. (2001) Patterned Magnetic Recording Media, *Annu. Rev. Mater. Res.* 31(1), 203-238.
2. Yang, X. et al. (2008) Toward 1 Tdot/in.$^2$ nanoimprint lithography for magnetic bit-patterned media: Opportunities and challenges *J. Vac. Sci. Technol.* 26(6), 2604-2610
3. Ruiz, R. et al. (2008) *Density Multiplication and Improved Lithography by Directed Block Copolymer Assembly, Science* 321(5891), 936-939.
4. Bates, F. S. and Fredrickson, G H. (1990) Block Copolymer Thermodynamics: Theory and Experiment, *Annu. Rev. Phys. Chem.* 41, 525-557.
5. Li, M. and Ober, C. K. (2006) Block copolymer patterns and templates, *Mater. Today* 9(9), 30-39.
6. Colburn, M. et al. (2000) Step and flash imprint lithography for sub-100-nm patterning, *Proc. SPIE-Int. Soc. Opt. Eng.* 3997, 453-457.
7. Kim, H.-C. et al. (2001) A Route to Nanoscopic $SiO_2$ Posts via Block Copolymer Templates, *Adv. Mater* 13(11), 795-797.
8. Nagarajan, S. et al. (2008) An Efficient Route to Mesoporous Silica Films with Perpendicular Nanochannels, *Adv. Mater.* 20(2), 246-251.
9. Lammertink, R. G H. et al. (2000) Nanostructured Thin Films of Organic-Organometallic Block Copolymers: One-Step Lithography with Poly(ferrocenylsilanes) by Reactive Ion Etching, Adv. Mater 12(2), 98-103.
10. Willson, C. G et al. "Silicon-Containing Block Co-Polymers, Methods for Synthesis and Use," United States Patent Application PCT/US11/28867, filed Mar. 17, 2011.
11. Gorham, W. F. (1966) A New, General Synthetic Method for the Preparation of Linear Poly-p-xylylenes, *Journal of Polymer Science Part A-1: Polymer Chemistry* 4(12), 3027-3039.
12. Gillham, J. K. (1986) *Formation and Properties of Thermosetting and High $T_g$ Polymeric Materials, Polym. Eng. Sci.* 26(20), 1429-1433.
13. Milner, S. T. (1991) Polymer brushes, *Science* 251 (4996), 905+.
14. Zhao, B. and Brittain, W. J. (2000) Polymer brushes: surface-immobilized macromolecules, *Prog. Polym. Sci.* 25(5), 677-710.
15. Fortin, J. B. and Lu, T. M. (2000) Mass spectrometry study during the vapor deposition of poly-para-xylylene thin films, *Journal of Vacuum Science & Technology A: Vacuum, Surfaces, and Films* 18(5), 2459-2465.
16. Stewart, J. "Parylene deposition chamber," U.S. Pat. No. 4,945,856 application Ser. No. 07/211,338, filed Jun. 23, 1988. (Published Aug. 7, 1990).

17. Stewart, J. "Parylene deposition chamber and method of use," U.S. Pat. No. 5,078,091 application Ser. No. 07/494,985, filed Mar. 15, 1990. (Published Jan. 7, 1992).
18. Stewart, J. "Table top parylene deposition chamber," U.S. Pat. No. 5,268,033 application Ser. No. 07/723,841, filed Jul. 1, 1991. (Published Dec. 7, 1993).
19. Stewart, J. "Tangential flow cold trap," U.S. Pat. No. 5,488,833 application Ser. No. 08/312,097, filed Sep. 26, 1994. (Published Feb. 6, 1996).
20. Beach, W. F., Wary, J., and Olson, R. A. "Parylene deposition apparatus including a tapered deposition chamber and dual vacuum outlet pumping arrangement," U.S. Pat. No. 5,534,068 application Ser. No. 08/549,169, filed Oct. 27, 1995. (Published Jul. 9, 1996).
21. Wary, J., Olson, R. A., and Beach, W. F. "Parylene deposition apparatus including an atmospheric shroud and inert gas source," U.S. Pat. No. 5,536,319 application Ser. No. 08/549,093, filed Oct. 27, 1995. (Published Jul. 16, 1996).
22. Olson, R. A., Wary, J., and Beach, W. F. "Parylene deposition apparatus including an atmospheric shroud and inert gas source," U.S. Pat. No. 5,536,321 application Ser. No. 08/549,131, filed Oct. 27, 1995. (Published Jul. 16, 1996).
23. Wary, J., Olson, R. A., and Beach, W. F. "Parylene deposition apparatus including a heated and cooled support platen and an electrostatic clamping device," U.S. Pat. No. 5,536,322 application Ser. No. 08/549,635, filed Oct. 27, 1995. (Published Jul. 16, 1996).
24. Beach, W. F., Olson, R. A., and Wary, J. "Method and apparatus for the deposition of parylene AF4 onto semiconductor wafers," U.S. Pat. No. 5,538,758 application Ser. No. 08/549,087, filed Oct. 27, 1995. (Published Jul. 23, 1996).
25. Olson, R. A., Wary, J., and Beach, W. F. "Parylene deposition apparatus including dry vacuum pump system and downstream cold trap," U.S. Pat. No. 5,556,473 application Ser. No. 08/549,130, filed Oct. 27, 1995. (Published Sep. 17, 1996).
26. Stewart, J. "Modular parylene deposition apparatus having vapor deposition chamber extension," U.S. Pat. No. 5,641,358 application Ser. No. 08/541,402, filed Oct. 10, 1995. (Published Jun. 24, 1997).
27. Olson, R. A., Beach, W. F., and Wary, J. "Parylene deposition apparatus including a heated and cooled dimer crucible," U.S. Pat. No. 5,709,753 application Ser. No. 08/549,395, filed Oct. 27, 1995. (Published Jan. 20, 1998).
28. Stewart, J. "Parylene deposition chamber and method of use," U.S. Pat. No. 6,406,544 application Ser. No. 08/068,753 filed Jul. 8, 1993. (Published Jun. 18, 2002).
29. Stewart, J. "Method of preparing thin supported films by vacuum deposition," U.S. Pat. No. 6,737,224 application Ser. No. 09/83,6794, filed Apr. 17, 2001. (Published May 18, 2004).
30. Kim, H.-C., Park, S.-M., and Hinsberg, W. D. (2009) Block Copolymer Based Nanostructures: Materials, Processes, and Applications to Electronics, *Chemical Reviews* 110(1), 146-177.
31. Park, M. et al. (1997) Block Copolymer Lithography: Periodic Arrays of ~1011 Holes in 1 Square Centimeter, *Science* 276(5317), 1401-1404.
32. Han, E. et al. (2009) Perpendicular Orientation of Domains in Cylinder-Forming Block Copolymer Thick Films by Controlled Interfacial Interactions, *Macromolecules* 42(13), 4896-4901.
33. Ryu, D. Y. et al. (2007) Surface Modification with Cross-Linked Random Copolymers: Minimum Effective Thickness, *Macromolecules* 40(12), 4296-4300.
34. Walton, D. G. et al. (1994) A Free Energy Model for Confined Diblock Copolymers, *Macromolecules* 27(21), 6225-6228.
35. Bates, C. M. et al. (2011) Polymeric Cross-Linked Surface Treatments for Controlling Block Copolymer Orientation in Thin Films, *Langmuir* 27(5), 2000-2006.
36. Masataka, E. "Method for promoting self-formation of block copolymer and method for forming self-formation pattern of block copolymer using the method for promoting self-formation," Japanese Patent Application JP 2010-115832A Application JP 2008-289806, filed Nov. 12, 2008 (Published May 27, 2010).
37. Endou, M. and Sasago, M. "Method of Accelerating Self-Assembly of Block Copolymer and Method of Forming Self-Assembled Pattern of Block Copolymer Using the Accelerating Method," United States Patent Application 20110186544 application Ser. No. 13/085,954, filed Apr. 13, 2011. (Published Aug. 4, 2011).

The invention claimed is:

1. A layered structure comprising first, second and third layers on a surface, wherein said first layer comprises a surface energy neutralizing layer, wherein said second layer comprises a block copolymer film, wherein said block copolymer comprises a triblock copolymer, and wherein said third layer comprises a poly(p-xylylene) polymer.

2. The structure of claim 1, wherein said layered structure further comprises nano structures.

3. The structure of claim 2, wherein said nanostructures comprise cylindrical structures, said cylindrical structures being substantially vertically aligned with respect to the plane of the surface.

4. The structure of claim 1, wherein said surface is selected from the group consisting of: silicon, glass, or quartz.

5. The structure of claim 1, wherein said poly(p-xylylene) polymer is selected from the group consisting of the following structures:

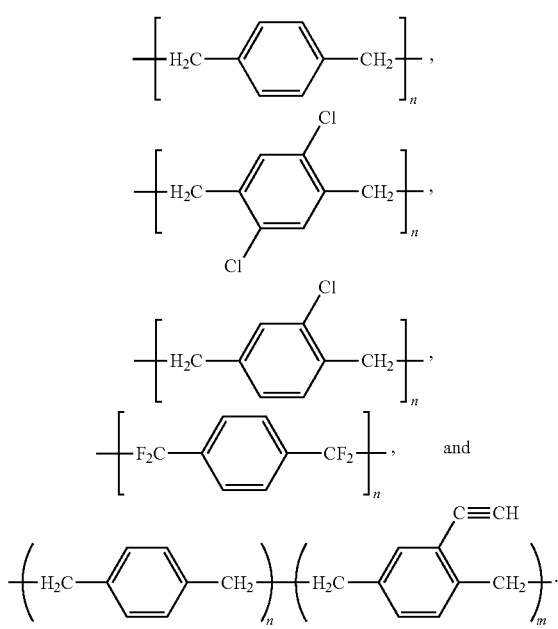

6. The structure of claim 1, wherein said block copolymers selected from the group consisting of the following structures:

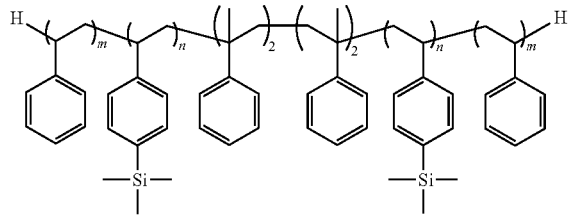

and

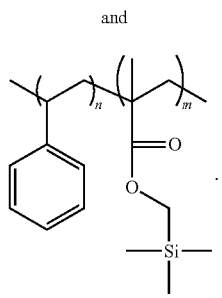

7. The structure of claim 1, wherein said block copolymer is made from at least two monomers.

8. The structure of claim 7, wherein said second monomer comprises a silicon atom that can be polymerized.

9. The structure of claim 7, wherein said first monomer comprises a monomer lacking silicon that can be polymerized.

10. The structure of claim 7, wherein said second monomer is trimethyl-(2-methylene-but-3-enyl)silane.

11. The structure of claim 7, wherein said second monomer is trimethylsilylstyrene.

12. The structure of claim 7, wherein said second monomer is a silicon-containing methacrylate.

13. The structure of claim 7, wherein said second monomer is methacryloxymethyltrimethylsilane.

14. A layered structure comprising first, second and third layers on a surface, wherein said first layer comprises a surface energy neutralizing layer, wherein said second layer comprises a block copolymer film, and wherein said third layer comprises a poly(p-xylylene) polymer, wherein said surface energy neutralizing layer comprises a polymer selected from the group consisting of:

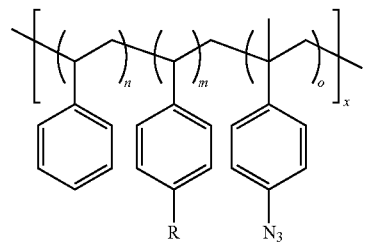 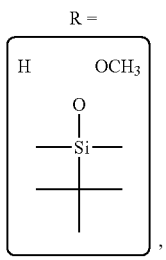

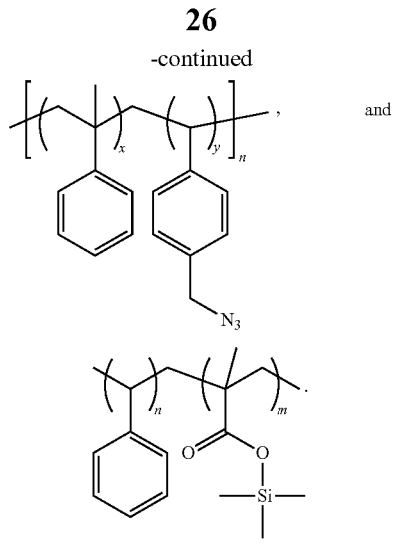

15. The structure of claim 14, wherein said poly(p-xylylene) polymer is selected from the group consisting of the following structures:

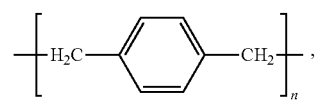

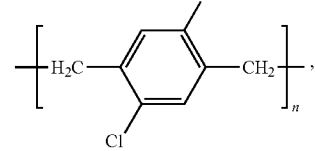

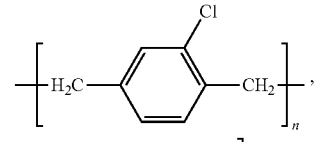

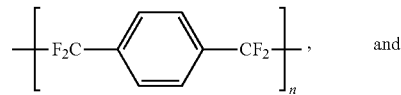

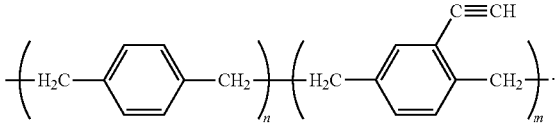

16. The structure of claim 14, wherein said block copolymers selected from the group consisting of the following structures:

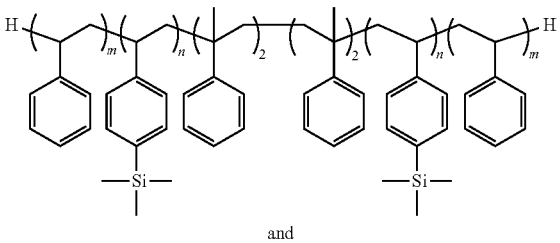

and

-continued

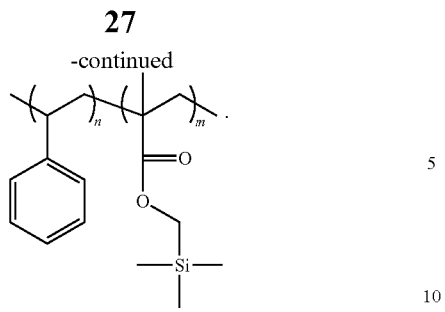

17. The structure of claim 14, wherein said layered structure further comprises nano structures.

18. The structure of claim 17, wherein said nanostructures comprise cylindrical structures, said cylindrical structures being substantially vertically aligned with respect to the plane of the surface.

19. The structure of claim 17, wherein said surface is selected from the group consisting of: silicon, glass, or quartz.

20. A layered structure comprising first, second and third layers on a surface, wherein said first layer comprises a surface energy neutralizing layer, wherein said second layer comprises a block copolymer film wherein said block copolymer is made from at least two monomers, wherein at least one of the monomers is methacryloxymethyltrimethylsilane, and wherein said third layer comprises a poly(p-xylylene) polymer.

* * * * *